United States Patent
Itoh et al.

(10) Patent No.: US 8,393,227 B2
(45) Date of Patent: Mar. 12, 2013

(54) SUBSTRATE PROCESSING METHOD, STORAGE MEDIUM STORING PROGRAM FOR EXECUTING THE SAME, SUBSTRATE PROCESSING APPARATUS, AND FAULT DETECTION METHOD FOR DIFFERENTIAL PRESSURE FLOWMETER

(75) Inventors: Norihiro Itoh, Kumamoto (JP); Hiroyuki Kudoh, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 167 days.

(21) Appl. No.: 13/035,010

(22) Filed: Feb. 25, 2011

(65) Prior Publication Data
US 2011/0209560 A1    Sep. 1, 2011

(30) Foreign Application Priority Data

Feb. 26, 2010  (JP) .................... 2010-043023
Dec. 1, 2010   (JP) .................... 2010-268389

(51) Int. Cl.
*G01F 1/34* (2006.01)
(52) U.S. Cl. ............... 73/861.42; 73/861.44; 73/861.45
(58) Field of Classification Search ............... 73/861.42
See application file for complete search history.

(56) References Cited

U.S. PATENT DOCUMENTS

| | | | | |
|---|---|---|---|---|
| 4,311,436 A | * | 1/1982 | Hendriks | 417/2 |
| 4,476,707 A | * | 10/1984 | Burns et al. | 73/861.52 |
| 4,754,651 A | * | 7/1988 | Shortridge et al. | 73/861.42 |
| 4,817,426 A | * | 4/1989 | Igenbergs et al. | 73/180 |
| 5,293,778 A | * | 3/1994 | Schneiter | 73/198 |
| 6,119,710 A | * | 9/2000 | Brown | 137/14 |
| 6,216,726 B1 | * | 4/2001 | Brown et al. | 137/486 |
| 6,609,431 B1 | * | 8/2003 | Tietsworth et al. | 73/861.52 |
| 6,705,173 B1 | * | 3/2004 | Elberson | 73/861.42 |
| 6,917,886 B2 | * | 7/2005 | Cohen et al. | 702/45 |
| 7,073,392 B2 | * | 7/2006 | Lull et al. | 73/861 |
| 7,273,063 B2 | * | 9/2007 | Lull et al. | 137/12 |
| 2006/0225772 A1 | * | 10/2006 | Jones | 134/56 R |
| 2009/0193908 A1 | * | 8/2009 | Dana | 73/861.08 |

FOREIGN PATENT DOCUMENTS

| | | |
|---|---|---|
| JP | 2001-125649 A | 5/2001 |
| JP | 2006-153677 A | 6/2006 |
| JP | 2008-034490 A | 2/2008 |

* cited by examiner

*Primary Examiner* — Lisa Caputo
*Assistant Examiner* — Jonathan Dunlap
(74) *Attorney, Agent, or Firm* — Pearne & Gordon LLP

(57) ABSTRACT

There is provided a substrate processing method of supplying a processing solution to a substrate through a supply nozzle connected with a supply path via a differential pressure flowmeter provided on the supply path for supplying the processing solution and performing a process on the substrate by the processing solution. The substrate processing method includes measuring a pressure value in the supply path by a pressure measurement unit included in the differential pressure flowmeter when the processing solution is not supplied to the substrate; determining whether the pressure measurement unit is operated normally by comparing the pressure value measured in the measuring process with a predetermined pressure value; and supplying the processing solution to a substrate if it is determined that the pressure measurement unit is operated normally in the determining process.

13 Claims, 13 Drawing Sheets

SUBSTRATE PROCESSING METHOD, STORAGE MEDIUM STORING PROGRAM FOR EXECUTING THE SAME, SUBSTRATE PROCESSING APPARATUS, AND FAULT DETECTION METHOD FOR DIFFERENTIAL PRESSURE FLOWMETER

CROSS-REFERENCE TO RELATED APPLICATION

This application claims the benefit of Japanese Patent Application Nos. 2010-043023 and 2010-268389 filed on Feb. 26, 2010 and Dec. 1, 2010, respectively, the entire disclosures of which are incorporated herein by reference.

FIELD OF THE INVENTION

The present disclosure relates to a substrate processing method using a processing solution, a storage medium storing a program for executing the substrate processing method, a substrate processing apparatus, and a fault detection method for a differential pressure flowmeter.

BACKGROUND OF THE INVENTION

In a manufacturing process of a semiconductor device or a flat panel display (FPD), there has often been used a liquid process in which a processing solution is supplied to a target substrate (hereinafter, referred to as "substrate" or "wafer") such as a semiconductor wafer or a glass substrate. An example of this process is a cleaning process for removing particles or contamination adhering to a substrate.

As a substrate processing apparatus for performing a process such as the above-mentioned cleaning process on a substrate, there has been used an apparatus including a multiple number of single-wafer liquid processing units and a transfer mechanism. The liquid processing units perform a process by supplying a processing solution to a front surface or front and rear surfaces of a substrate such as a semiconductor wafer while the substrate is held and rotated on a spin chuck. The transfer mechanism loads and unloads the substrate to and from these liquid processing units. Further, in order to suppress an increase in footprint of the apparatus and obtain higher throughput, the liquid processing units may be stacked in multiple layers.

In the substrate processing apparatus, a processing solution nozzle (hereinafter, referred to as "supply nozzle") for supplying a processing solution (chemical solution) may be switchably connected to a multiple number of chemical solution supply systems via a mixing valve (see, for example, Patent Document 1). In Patent Document 1, a flow rate control mechanism corresponding to each chemical solution supply system is installed between each chemical solution supply system and the mixing valve.

Meanwhile, a flow rate control mechanism may include a differential pressure flowmeter provided on the way of a flow path through which a fluid flows; a valve for controlling a flow of the fluid; and a controller for controlling an opening degree of the valve (see, for example, Patent Document 2). In Patent Document 2, the controller controls the opening degree of the valve based on a preset flow rate and a flow rate of the fluid measured by the differential pressure flowmeter. The differential pressure flowmeter may include a round tube; a first pressure gauge placed on an upstream side of the round tube; and a second pressure gauge placed on a downstream side of the round tube. The first pressure gauge measures a pressure of the fluid introduced into the round tube. The second pressure gauge measures a pressure of the fluid discharged from the round tube.

Patent Document 1: Japanese Patent Laid-open Publication No. 2008-34490
Patent Document 2: Japanese Patent Laid-open Publication No. 2006-153677

However, the above-described substrate processing method for processing the substrate by using the processing solution has problems as follows.

As described above, the flow rate control mechanism controls the opening degree of the valve such that a measurement value of the flow rate measured by the differential pressure flowmeter is close to the preset flow rate. Further, by way of example, the differential pressure flowmeter includes a component such as a round tube to make a flow path narrow, the first pressure gauge on an upstream side of the component and the second pressure gauge on a downstream side of the component. The differential pressure flowmeter obtains a measurement value of the flow rate based on a measurement value of the first pressure gauge and a measurement value of the second pressure gauge.

Even if the measurement value of the first pressure gauge or the measurement value of the second pressure gauge is deviated from a true value due to an electrical fault in the first pressure gauge or the second pressure gauge, the differential pressure flowmeter may calculate a measurement value of the flow rate based on the deviated value. At this time, the flow rate control mechanism may control this deviated flow rate to be close to the preset flow rate. Accordingly, by way of example, even though it is displayed on the flow rate control mechanism that the controlled flow rate is equal to the preset flow rate, an actual flow rate may be further deviated from the preset flow rate.

If the measurement value of the flow rate is deviated from the true value as described above, it is difficult to gauge the true value of the flow rate unless a flow rate of the processing solution supplied through the supply nozzle is directly measured by a measuring cup. Therefore, if the measurement value of the flow rate measured by the differential pressure flowmeter is deviated from the true value due to, for example, an electrical fault in the first pressure gauge or the second pressure gauge, there has been a problem in that it is not easy to detect such deviation.

Meanwhile, there is a differential pressure flowmeter using a differential pressure sensor in which a pressure difference on an upstream side and a downstream side is measured by a diaphragm provided to shut a communication unit for communication between the upstream side and the downstream side. In this differential pressure flowmeter using the differential pressure sensor, there may be a case where a measurement value of a flow rate is deviated from a true value due to a bending or deformation of the diaphragm. In this case, there has been a problem in that it is not easy to detect such deviation.

BRIEF SUMMARY OF THE INVENTION

In view of the foregoing, the present disclosure provides a substrate processing method, a substrate processing apparatus and a fault detection method for a differential pressure flowmeter capable of easily detecting deviation of a measurement value of a flow rate measured by the differential pressure flowmeter provided on a supply path for supplying a processing solution from a true value.

In order to solve the above-described problems, the present disclosure provides the following means.

In accordance with one aspect of the present disclosure, there is provided a substrate processing method of supplying a processing solution to a substrate through a supply nozzle connected with a supply path via a differential pressure flowmeter provided on the supply path for supplying the processing solution and performing a process on the substrate by the processing solution. The substrate processing method includes measuring a pressure value in the supply path by a pressure measurement unit included in the differential pressure flowmeter when the processing solution is not supplied to the substrate; determining whether the pressure measurement unit is operated normally by comparing the pressure value measured in the measuring process with a predetermined pressure value; and supplying the processing solution to a substrate if it is determined that the pressure measurement unit is operated normally in the determining process.

In the substrate processing method, the measuring process may measure pressures in the supply path on an upstream side and on a downstream side of a throttling unit provided on the supply path to narrow the supply path by the pressure measurement unit when the processing solution is not supplied to the substrate. Further, the determining process may determine whether the pressure measurement unit is operated normally by comparing an absolute value of a pressure difference between the pressures in the supply path on the upstream side and on the downstream side measured in the measuring process with a predetermined differential pressure upper limit value.

In the substrate processing method, the pressure measurement unit may include a first pressure gauge configured to measure the pressure in the supply path on the upstream side; and a second pressure gauge configured to measure the pressure in the supply path on the downstream side. Here, the pressure difference may be a difference between a first pressure measurement value measured by the first pressure gauge and a second pressure measurement value measured by the second pressure gauge. Further, the measuring process may measure the pressure when connection between the supply system and the supply path is blocked.

The substrate processing method may further include correcting an offset value of the first pressure gauge or an offset value of the second pressure gauge so as to allow the first pressure measurement value or the second pressure measurement value to become equal to a predetermined pressure reference value when the absolute value of the pressure difference is greater than the differential pressure upper limit value.

In the substrate processing method, the processing solution may be supplied to the substrate after the substrate is loaded into a processing unit configured to supply the processing solution to the substrate. Further, the measuring process may be performed after the processing solution is supplied to the substrate by the processing unit. Furthermore, the supplying process may supply the processing solution to a next substrate subsequently loaded into the processing unit when it is determined that the pressure measurement unit is operated normally in the determining process.

In the substrate processing method, the processing solution may be supplied to the substrate after the substrate is loaded into a processing unit configured to supply the processing solution to the substrate. Further, the measuring process may be performed after the processing solution is supplied to the substrate by the processing unit. Furthermore, the supplying process may supply the processing solution to a next substrate subsequently loaded into the processing unit if it is determined that the pressure measurement unit is operated normally in the determining process. Moreover, a next substrate may not be loaded into the processing unit if it is determined that the pressure measurement unit is not operated normally in the determining process.

In the substrate processing method, a drying process may be performed to remove the processing solution from the substrate during the measuring process and the determining process.

In accordance with another aspect of the present disclosure, there is provided a substrate processing apparatus configured to perform a process on a substrate by a processing solution. The substrate processing apparatus includes a processing unit configured to accommodate the substrate; a supply nozzle configured to supply the processing solution to the substrate; and a differential pressure flowmeter provided on the way of a supply path connecting a supply system configured to supply the processing solution to the supply nozzle with the supply nozzle. Here, it is determined whether the differential pressure flowmeter is operated normally by comparing an absolute value of a pressure difference measured by the differential pressure flowmeter with a predetermined differential pressure upper limit value when the processing solution is not supplied to the substrate, and the processing solution is supplied to a substrate if it is determined that the differential pressure flowmeter is operated normally.

In the substrate processing apparatus, the differential pressure flowmeter may include a throttling unit configured to narrow the supply path; a first pressure gauge configured to measure a pressure in the supply path on an upstream of the throttling unit; a second pressure gauge configured to measure a pressure in the supply path on a downstream of the throttling unit; a flow rate control valve provided on the supply path; and a flow rate controller configured to control an opening degree of the flow rate control valve based on a pressure difference between a first pressure measurement value measured by the first pressure gauge and a second pressure measurement value measured by the second pressure gauge. Further, it may be determined whether the first pressure gauge and the second pressure gauge are operated normally by comparing the absolute value of the pressure difference with the predetermined differential pressure upper limit value when the processing solution is not supplied to the substrate, so that it is determined whether the differential pressure flowmeter is operated normally.

The substrate processing apparatus may further include a transfer mechanism configured to load the substrate into the processing unit. Further, a pressure in the supply path may be measured after the processing solution is supplied to the substrate in the processing unit. Furthermore, a next substrate may be loaded into the processing unit by the transfer mechanism and the processing solution may be supplied to the loaded next substrate if it is determined that the differential pressure flowmeter is operated normally.

The substrate processing apparatus may further include a transfer mechanism configured to load the substrate into the processing unit. Further, a pressure in the supply path may be measured after the processing solution may be supplied to the substrate in the processing unit. Furthermore, a next substrate may be loaded into the processing unit by the transfer mechanism and the processing solution is supplied to the loaded next substrate if it is determined that the differential pressure flowmeter is operated normally. Moreover, a next substrate may not be loaded into the processing unit when it is determined that the differential pressure flowmeter is not operated normally.

In accordance with still another aspect of the present disclosure, there is provided a fault detection method for a differential pressure flowmeter provided on a supply path configured to supply a processing solution. The fault detection method includes measuring a pressure in the supply path by a pressure measurement unit included in the differential pressure flowmeter when the processing solution is not supplied; and determining whether the pressure measurement unit is operated normally by comparing a pressure value measured in the measuring process with a predetermined pressure value.

In accordance with the present disclosure, the substrate processing apparatus including the supply nozzle for supplying the processing solution to the substrate can easily detect deviation of the measurement value of the flow rate measured by the differential pressure flowmeter provided on the supply path for supplying the processing solution to the supply nozzle from the true value.

BRIEF DESCRIPTION OF THE DRAWINGS

Non-limiting and non-exhaustive embodiments will be described in conjunction with the accompanying drawings. Understanding that these drawings depict only several embodiments in accordance with the disclosure and are, therefore, not to be intended to limit its scope, the disclosure will be described with specificity and detail through use of the accompanying drawings, in which.

DETAILED DESCRIPTION OF THE INVENTION

Hereinafter, embodiments of the present disclosure will be described with reference to the accompanying drawings. Herein, there will be explained a case where the present disclosure is applied to a substrate processing apparatus which performs a cleaning process to front and rear surfaces of a semiconductor wafer (hereinafter, simply referred to as "wafer").

Embodiment

There will be explained a schematic configuration of a substrate processing apparatus in accordance with an embodiment of the present disclosure with reference to FIGS. 1 to 3.

Figure 1:
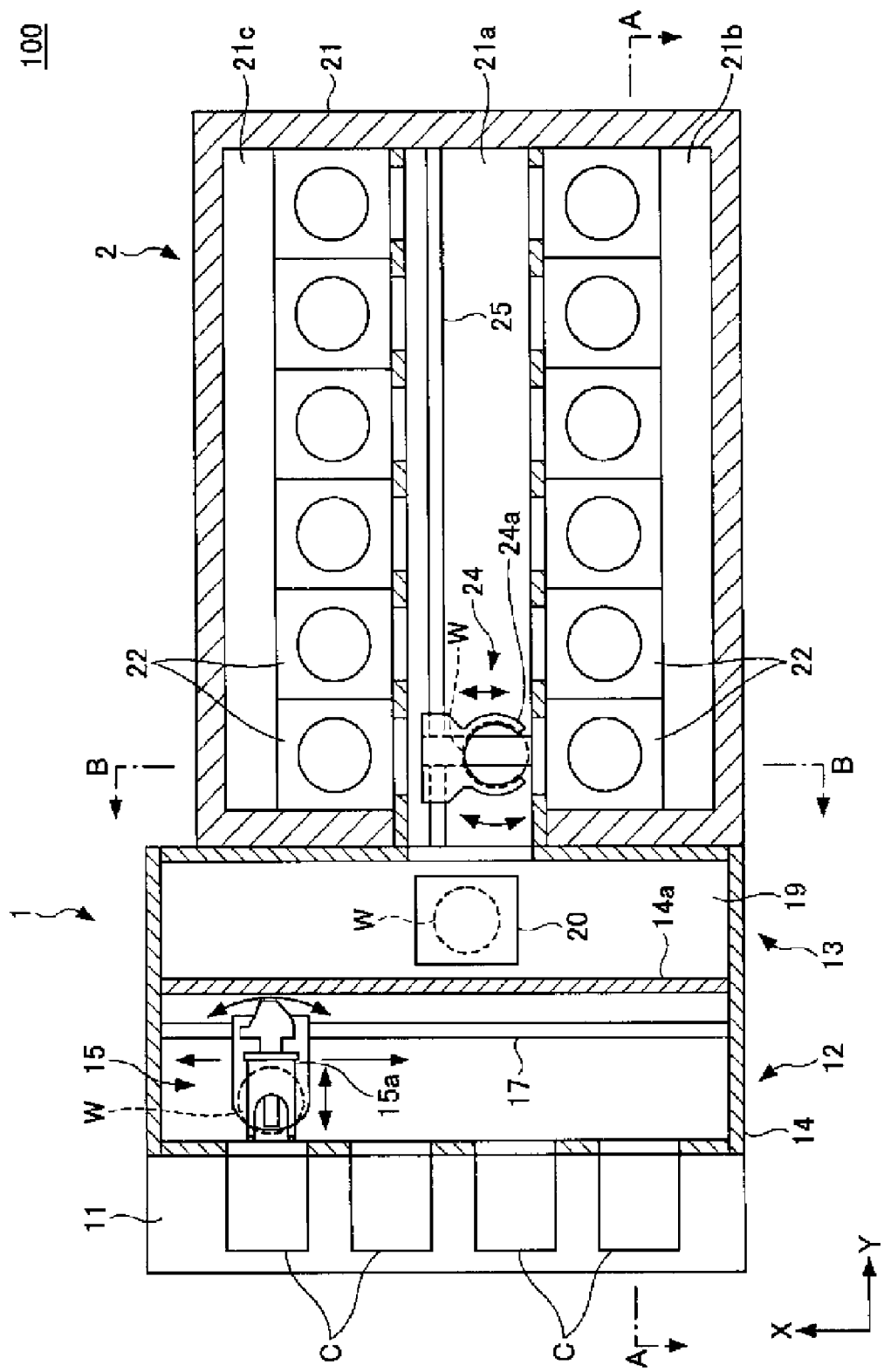
FIG. 1 is a plane view showing a schematic configuration of a substrate processing apparatus in accordance with an embodiment of the present disclosure.
Figure 2:
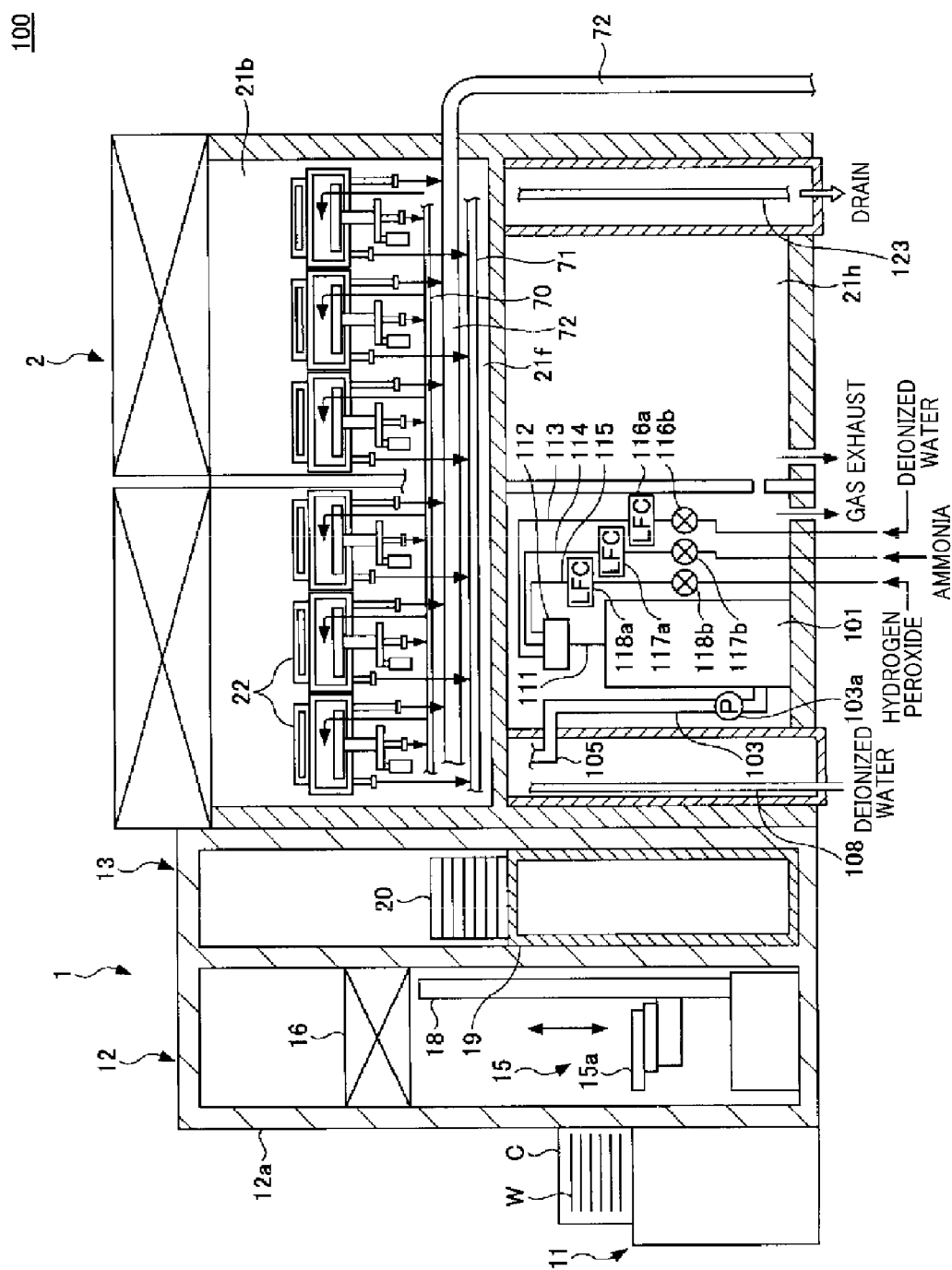
FIG. 2 is a front cross-sectional view taken along a line A-A of FIG. 1.
Figure 3:
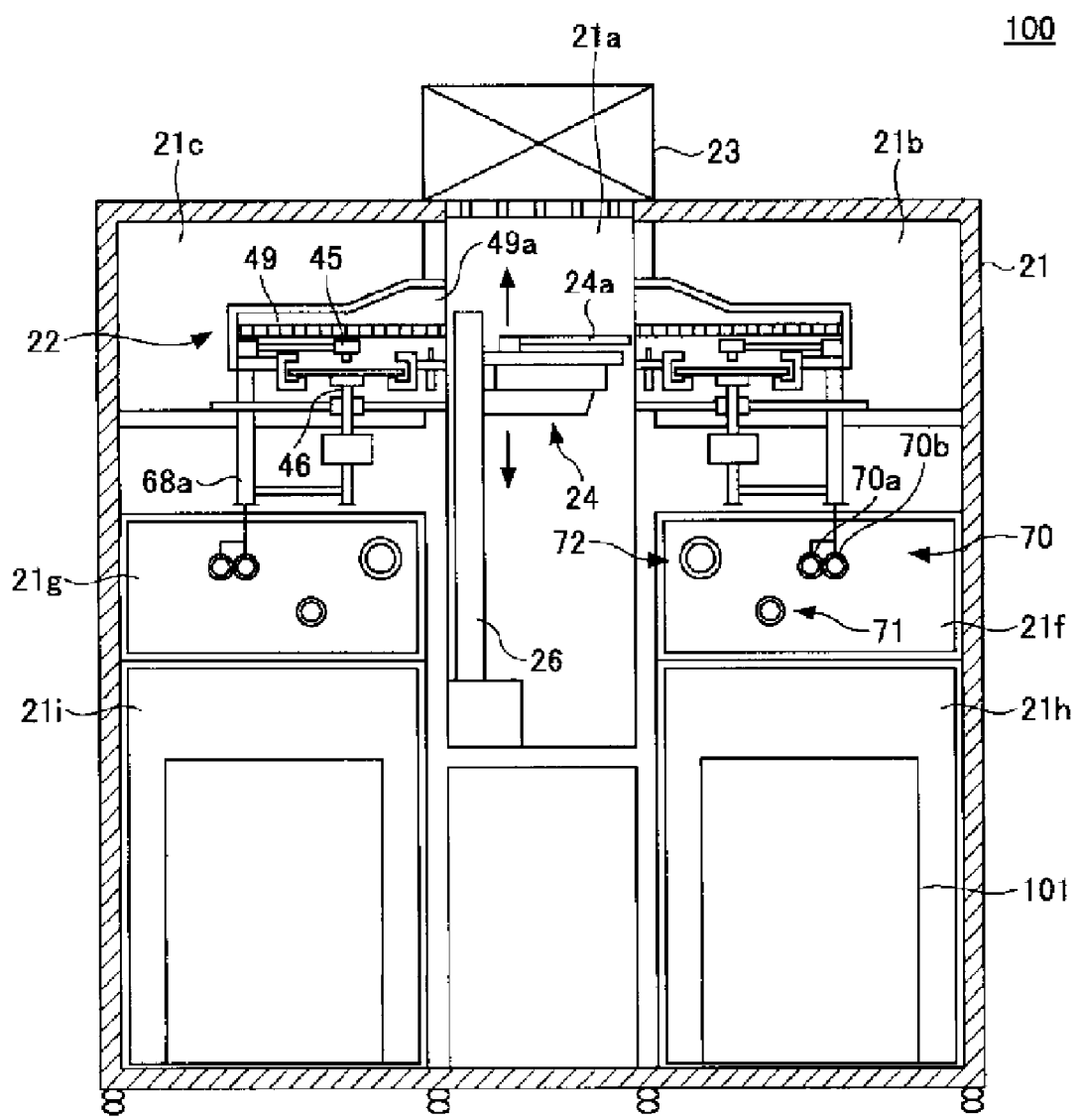
FIG. 3 is a side cross-sectional view taken along a line B-B of FIG. 1.

FIG. 1 is a plane view showing a schematic configuration of the substrate processing apparatus in accordance with the embodiment of the present disclosure, FIG. 2 is a front cross-sectional view taken along a line A-A of FIG. 1, and FIG. 3 is a side cross-sectional view taken along a line B-B of FIG. 1.

This substrate processing apparatus 100 may include a loading/unloading station (substrate loading/unloading section) 1 which mounts wafer carriers C for accommodating a multiple number of wafers W and loads/unloads the wafers W; and a processing station (liquid processing section) 2 which performs a cleaning process to the wafers W. The loading/unloading station (substrate loading/unloading section) 1 and the processing station (liquid processing section) 2 are arranged to be adjacent to each other.

The loading/unloading station 1 may include a carrier mounting unit 11, a transfer unit 12, a transit unit 13, and a housing 14. The carrier mounting unit 11 mounts the wafer carriers C for horizontally accommodating a multiple number of wafers W. The transfer unit 12 transfers the wafers W. The transit unit 13 delivers the wafers W. The housing 14 accommodates the transfer unit 12 and the transit unit 13.

The carrier mounting unit 11 may mount four wafer carriers C thereon. The wafer carrier C mounted on the carrier mounting unit 11 is closely contacted to a vertical wall 12a of the housing 14 and the wafer W therein can be loaded into the transfer unit 12 without be exposed to the atmosphere.

The housing 14 may include a partition 14a which vertically divides the transfer unit 12 and the transit unit 13. The transfer unit 12 may include a transfer mechanism 15; and a fan filter unit (FFU) 16 which is positioned above the transfer mechanism 15 and supplies downflow of clean air. The transfer mechanism 15 may include a wafer holding arm 15a for holding the wafer W; and a mechanism for moving the wafer holding arm 15a back and forth. Further, the transfer mechanism 15 may further include a mechanism for moving the wafer holding arm 15a along a horizontal guide 17 (see FIG. 1) extended in an X-direction, i.e., a direction of arrangement of the wafer carriers C; a mechanism for moving the wafer holding arm 15a along a vertical guide 18 (see FIG. 2) provided in a vertical direction; and a mechanism for rotating the wafer holding arm 15a on a horizontal surface. The transfer mechanism 15 may be configured to transfer the wafer W between the wafer carrier C and the transit unit 13.

The transit unit 13 may include a transit stage 19; and a transit rack 20 which is placed on the transit stage 19 and has a multiple number of mounting tables capable of mounting the wafer W thereon. The transit unit 13 is configured to transfer the wafer W to the processing station 2 via the transit rack 20.

As depicted in FIG. 3, the processing station 2 may include a housing 21 having a rectangular parallelepiped structure. The processing station 2 may further include a transfer chamber 21a serving as a transfer path extended along a Y-direction orthogonal to the X-direction, i.e., the direction of arrangement of the wafer carriers C, at a central upper region within the housing 21; and two unit chambers 21b and 21c positioned on both sides of the transfer chamber 21a within the housing 21. In each of the unit chambers 21b and 21c, six liquid processing units 22, i.e., twelve in total are horizontally arranged along the transfer chamber 21a.

Provided under the unit chambers 21b and 21c within the housing 21 are pipe boxes 21f and 21g each accommodating pipes. Further, provided under the pipe boxes 21f and 21g are chemical solution supply units 21h and 21i each serving as a processing solution container.

Provided above the transfer chamber 21a is a fan filter unit (FFU) 23 which supplies downflow of clean air to the transfer chamber 21a. Provided in the transfer chamber 21a is a transfer mechanism 24. The transfer mechanism 24 may include a wafer holding arm 24a for holding the wafer W; and a mechanism for moving the wafer holding arm 24a back and forth. Further, the transfer mechanism 24 may further include a mechanism for moving the wafer holding arm 24a along a horizontal guide 25 (see FIG. 1) provided in the transfer chamber 21a in a Y-direction; a mechanism for moving the wafer holding arm 24a along a vertical guide 26 (see FIG. 3) provided in a vertical direction; and a mechanism for rotating the wafer holding arm 24a on a horizontal surface. The transfer mechanism 24 is configured to load and unload the wafer W to and from each liquid processing unit 22.

In the pipe box 21f or 21g, a processing solution pipe set 70, a liquid drain pipe 71, and a gas exhaust pipe are horizontally arranged. By way of example, the processing solution pipe set 70 may include a SC1 pipe 70a which supplies an ammonia hydrogen peroxide mixture SC1 of ammonia water and hydrogen peroxide; and a deionized water pipe 70b which supplies deionized water.

Figure 4:
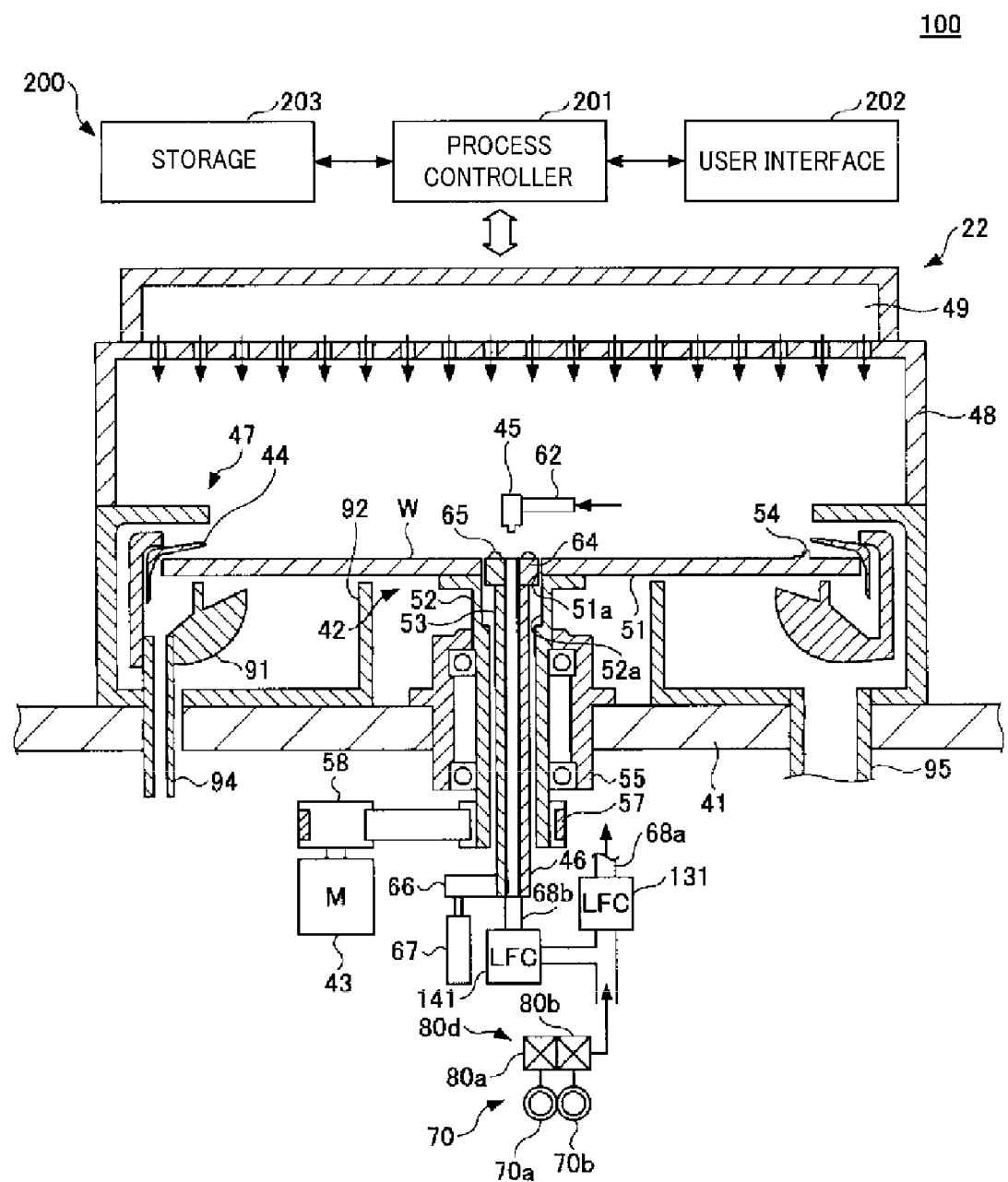
FIG. 4 is a cross-sectional view showing a schematic configuration of a liquid processing unit provided in the substrate processing apparatus of FIG. 1.

Hereinafter, there will be explained the liquid processing unit provided in the substrate processing apparatus in accordance with the embodiment with reference to FIGS. 3 and 4. FIG. 4 is a cross-sectional view showing a schematic configuration of the liquid processing unit provided in the substrate processing apparatus of FIG. 1

The liquid processing unit 22 corresponds to a processing unit in Claims.

As can be seen from an enlarged view of FIG. 4, the liquid processing unit 22 may include a base plate 41, a wafer holding unit 42, a rotation motor 43, a rotation cup 44, a front surface processing solution supply nozzle 45, a rear surface processing solution supply nozzle 46, and a gas/liquid drain unit (cup) 47. The wafer holding unit 42 holds the wafer W so as to be rotatable. The rotation motor 43 rotates the wafer holding unit 42. The rotation cup 44 is provided to surround the wafer W held on the wafer holding unit 42 and rotated together with the wafer holding unit 42. The front surface processing solution supply nozzle 45 supplies a processing solution to a front surface of the wafer W. The rear surface processing solution supply nozzle 46 supplies the processing solution to a rear surface of the wafer W. The gas/liquid drain unit (cup) 47 is provided at a periphery of the rotation cup 44.

A casing 48 is provided so as to cover a periphery of the gas/liquid drain unit (cup) 47 and an upper space of the wafer W. Provided on the casing 48 is an air flow introduction unit 49 which introduces air flow from the fan filter unit (FFU) 23, and as depicted in FIG. 3, the air flow is introduced through an opening 49a communicating with the transfer chamber 21a.

The wafer holding unit 42 may include a circular plate-shaped rotation plate 51 which is horizontally installed and has a round hole 51a in its center; and a cylindrical rotation shaft 52 which is connected to a periphery area of the hole 51a on a rear surface of the rotation plate 51 and vertically extended in a downward direction. Further, an elevator 53 having the rear surface processing solution supply nozzle 46 is installed so as to be vertically movable in a hole 52a and the hole 51a. Installed in the rotation plate 51 are three holders 54 (only one illustrated) which hold an outer periphery of the wafer W.

The rotation shaft 52 is supported by the base plate 41 via a bearing 55 so as to be rotatable. The rotation shaft 52 and a pulley 58 inserted into a shaft of the rotation motor 43 are wound by a belt 57, and, thus, the rotation shaft 52 can be rotated by the rotation motor 43.

Provided on an upper end of the elevator 53 is a wafer support 64 having wafer support pins 65. Further, a lower end of the elevator 53 is connected to a cylinder mechanism 67 via a connection member 66 and the wafer W is moved up and down by vertically moving the elevator 53 by the cylinder mechanism 67, and then the wafer W is loaded or unloaded.

The front surface processing solution supply nozzle 45 is held by the nozzle arm 62. The front surface processing solution supply nozzle 45 can be moved between a processing solution supply position above the wafer W and a retreat position by moving the nozzle arm 62 by a non-illustrated driving mechanism. In this way, the processing solution is supplied through the front surface processing solution supply nozzle 45 onto the surface of the wafer W.

The rear surface processing solution supply nozzle 46 is vertically provided in the center of the inside of the elevator 53 and the processing solution is supplied onto the rear surface of the wafer W through the rear surface processing solution supply nozzle 46.

Figure 5:
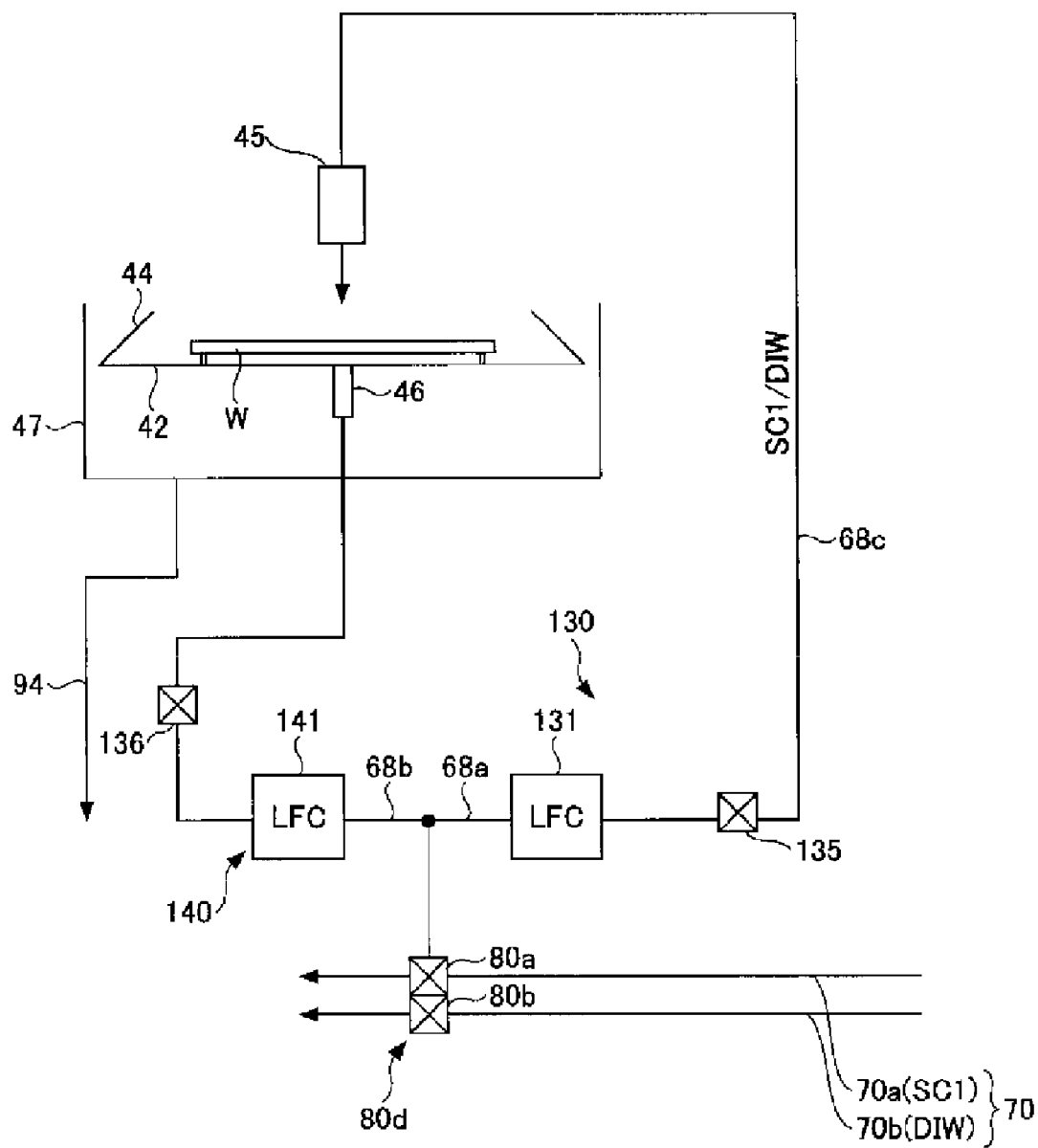
FIG. 5 shows a configuration of a processing solution supply mechanism of the liquid processing unit of FIG. 4.

The processing solution is supplied to the front surface processing solution supply nozzle 45 and the rear surface processing solution supply nozzle 46 via pipes 68a and 68b, respectively. The pipes 68a and 68b are respectively connected to the pipes 70a and 70b of the processing solution pipe set 70 horizontally provided within the pipe box 21f or the pipe box 21g via a supply system switching valve 80d including valves 80a and 80b connected to the pipes 70a and 70b. Further, provided on the way of the pipes 68a and 68b, i.e., on supply paths 68a and 68b to be described later with reference to FIG. 5 are liquid flow controllers (LFC) 131 and 141.

Hereinafter, the liquid flow controllers (LFC) 131 and 141 may be referred to as "flow rate control mechanisms."

Since the rotation cup 44 is rotated with the rotation plate 51, the processing solution scattered from the wafer W is suppressed to return to the wafer W and the processing solution is introduced downwardly.

The gas/liquid drain unit (cup) 47 may include an annular liquid drain cup 91 which receives the processing solution drained from the rotation cup 44; and an annular gas exhaust cup 92 which is provided outside the liquid drain cup 91 so as to surround the liquid drain cup 91.

An outmost part of a lower portion of the liquid drain cup 91 is connected to a liquid drain line 94.

The gas exhaust cup 92 is configured to exhaust mainly gas components inside and around the rotation cup 44 through an annular gap between the rotation cup 44 and the gas exhaust cup 92. Further, a bottom of the gas exhaust cup 92 is connected to a gas exhaust line 95 for exhausting the gas components.

Hereinafter, there will be explained the chemical solution supply units 21h and 21i with reference to FIG. 2. (Since the chemical solution supply unit 21h and the chemical solution supply unit 21i have the same configuration, there will be explained only the chemical solution supply unit 21h as a representative example.)

The chemical solution supply unit 21h may include a first chemical solution tank 101 which is provided on the side of the loading/unloading station 1 and stores, for example, an ammonia hydrogen peroxide mixture SC1 of ammonia water and hydrogen peroxide.

As depicted in FIG. 2, a lower side wall of the first chemical solution tank 101 is connected to a discharge line 103 for discharging the chemical solution therefrom, and the discharge line 103 is provided with a pump 103a and connected to a connection line 105. The connection line 105 is connected to one end of the SC1 pipe 70a of the processing solution pipe set 70 horizontally arranged in the pipe box 21f.

An upper part of the first chemical solution tank 101 is connected to a chemical solution supply pipe 111 and the chemical solution supply pipe 111 is connected to a mixing unit 112. The mixing unit 112 is connected to a deionized water pipe 113, an ammonia pipe 114, and a hydrogen peroxide pipe 115. The mixing unit 112 mixes deionized water, ammonia, and hydrogen peroxide, and the ammonia hydrogen peroxide mixture SC1 is supplied to the first chemical solution tank 101. Provided on the deionized water pipe 113 are a liquid flow controller (LFC) 116a and a valve 116b. Provided on the ammonia pipe 114 are a liquid flow controller (LFC) 117a and a valve 117b. Provided on the hydrogen peroxide pipe 115 are a liquid flow controller (LFC) 118a and a valve 118b.

In addition to a cleaning process using these chemical solutions, there is performed a rinse process using deionized water. At this time, the deionized water is supplied from a deionized water supply source via a pure water discharge line 108 and the deionized water pipe 70b.

The liquid drain pipe 71 provided in the pipe box 21f or 21g is connected to a drain pipe 123.

Further, the substrate processing apparatus 100 may include a controller 200 as depicted in FIG. 4. The controller 200 may include a process controller 201 such as a micro processor (computer), and each unit of the substrate processing apparatus 100 is configured to be connected to the process controller 201 and controlled by the process controller 201. The process controller 201 is connected to a user interface 202 such as a key board with which a process manager inputs commands to manage each unit or a display for visualizing and displaying an operational status of each unit of the substrate processing apparatus 100. Further, the process controller 201 is connected to a storage 203 which stores a control program for implementing various processes to be performed by the substrate processing apparatus 100 under the control of the process controller 201 or a control program, i.e., a recipe, for performing a predetermined process in each unit of the substrate processing apparatus 100 according to processing conditions. The recipe is stored in a storage medium (recording medium) in the storage 203. The storage medium (recording medium) may be a hard disk or a semiconductor memory. Otherwise, the recipe may be received appropriately from another apparatus via, for example, a dedicated line.

Further, if necessary, a certain recipe is retrieved from the storage 203 in response to a command from the user interface 202 and executed by the process controller 201, and then the a desired process is performed by the substrate processing apparatus 100 under the control of the process controller 201.

In the substrate processing apparatus 100 configured as described above, one sheet of wafer W is taken out of the wafer carrier C mounted on the carrier mounting unit 11 of the loading/unloading station 1 and the wafer W is mounted on the mounting table of the transit rack 20 on the transit stage 19 by the transfer mechanism 15, and this operation is performed successively. The wafer W mounted on the mounting table of the transit rack 20 is transferred and loaded into one of the liquid processing units 22 by the transfer mechanism 24 of the processing station 2.

In the liquid processing unit 22, the wafer W is held on the holder 54 and the wafer holding unit 42 is rotated together with the rotation cup 44 and the wafer W by the rotation motor 43. While the wafer holding unit 42 is rotated, a cleaning process is performed on the front and rear surfaces of the wafer W by supplying the processing solution through the front surface processing solution supply nozzle 45 and the rear surface processing solution supply nozzle 46. After the cleaning process using the processing solution, a deionized water rinse process is performed by supplying deionized water to each processing unit 22 through the deionized water pipe 70b, and a drying process is performed on the wafer W and then the cleaning process is terminated.

After the liquid process in this way, the wafer W is unloaded from the liquid processing unit 22 and mounted on the transit rack 20 of the transit stage 19 by the transfer mechanism 24 and then returned to the wafer carrier C from the transit rack 20 by the transfer mechanism 15.

Hereinafter, there will be explained a processing solution supply mechanism of the liquid processing unit in the substrate processing apparatus in accordance with an embodiment of the present disclosure with reference to FIGS. 5 to 8.

FIG. 5 shows a configuration of a processing solution supply mechanism of the liquid processing unit of FIG. 4. Further, in FIG. 5, same reference numerals will be assigned to same components explained above with reference to FIG. 4, and explanation thereof may be omitted.

The processing solution supply mechanism may include a first processing solution supply mechanism 130 and a second processing solution supply mechanism 140. The first processing solution supply mechanism 130 supplies a processing solution to a top surface (front surface) of a substrate and the second processing solution supply mechanism 140 supplies the processing solution to a bottom surface (rear surface) of the substrate.

The first processing solution supply mechanism 130 may include the front surface processing solution supply nozzle 45, the supply system switching valve 80d, the first LFC 131, and an opening/closing valve 135 which controls a supply of the processing solution to the front surface processing solution supply nozzle 45. The front surface processing solution supply nozzle 45 supplies the processing solution to the top surface (front surface) of the wafer W rotatably held on the wafer holding unit 42 within the gas/liquid drain unit (cup) 47. The supply system switching valve 80d switchably connects the multiple number of pipes 70a and 70b to the pipe 68a.

The second processing solution supply mechanism 140 may include the rear surface processing solution supply nozzle 46, the supply system switching valve 80d, the second LFC 141, and an opening/closing valve 136 which controls a supply of the processing solution to the rear surface processing solution supply nozzle 46. The rear surface processing solution supply nozzle 46 supplies the processing solution to the bottom surface (rear surface) of the substrate rotatably held on the wafer holding unit 42 within the gas/liquid drain unit (cup) 47. The supply system switching valve 80d switchably connects the multiple number of pipes 70a and 70b to the pipe 68b in order to supply the processing solution to the rear surface processing solution supply nozzle 46. The supply system switching valve 80d is shared with the first processing solution supply mechanism 130. Further, the second LFC 141 may have the same configuration as the first LFC 131. Accordingly, hereinafter, there will be explained the supply nozzle and the flow rate control mechanism of the first processing solution supply mechanism 130 as a representative example of the first processing solution supply mechanism 130 and the second processing solution supply mechanism 140.

The pipe (SC1 pipe) 70a and the pipe (deionized water pipe) 70b correspond to a supply system in Claims. Further, the processing solution pipe set 70 including the pipe (SC1 pipe) 70a and the pipe (deionized water pipe) 70b corresponds to a multiple number of supply systems in Claims.

The first LFC 131 is provided on the supply path 68a which connects the supply system switching valve 80d to the front surface processing solution supply nozzle 45 so as to control a flow rate of the processing solution flowing through the supply path 68a. The first LFC 131 may include a differential pressure flowmeter 132, a motor valve 133, and a flow rate controller 134 as described below with reference to FIG. 6.

The motor valve 133 corresponds to a flow rate control valve in Claims. Further, instead of the motor valve 133, various kinds of flow rate control valves for controlling a flow rate of the supply path may be used. By way of example, in order to control the flow rate of the supply path, an opening degree of the flow rate control valve can be controlled, or a multiple number of flow rate control valves are provided in parallel on the supply path and the number of flow rate control valves to be opened is controlled.

The front surface processing solution supply nozzle 45 is switchably connected to the first LFC 131 to be opened or closed by the opening/closing valve 135. The front surface processing solution supply nozzle 45 is connected to a supply path 68c via the opening/closing valve 135 and supplies the processing solution to the substrate at a first flow rate F1.

Here, the processing solution pipe set 70 serving as the multiple number of supply systems may be configured to supply various kinds of processing solutions different from each other. By way of example, the processing solution pipe set 70 includes a SC1 pipe for supplying an ammonia hydrogen peroxide mixture SC1, a DHF pipe for supplying a diluted hydrofluoric acid DHF, and a deionized water pipe for supplying deionized water DIW.

The front surface processing solution supply nozzle 45 supplies any one of the ammonia hydrogen peroxide mixture SC1 and the deionized water DIW to the substrate at the first flow rate F1 by switching the supply system switching valve 80d and the opening/closing valve 135. When the ammonia hydrogen peroxide mixture SC1 is supplied, the first flow rate F1 may be set to, for example, about 1200 mL/min, and when the deionized water DIW is supplied, the first flow rate F1 may be set to, for example, about 1800 mL/min.

Figure 6:
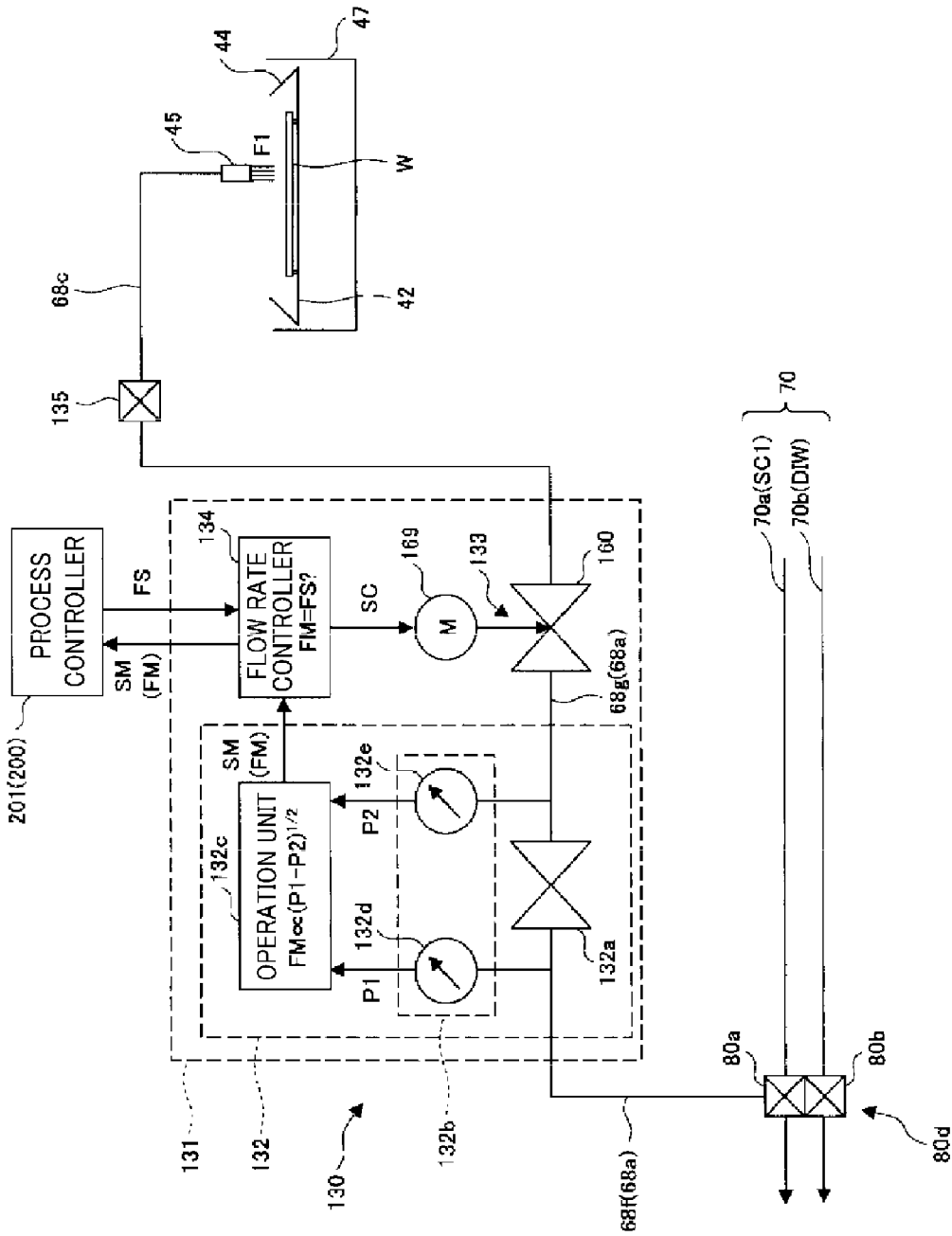
FIG. 6 shows a supply path including a first LFC from a supply system to a supply nozzle in the liquid processing unit of FIG. 5.

FIG. 6 shows the supply path including the first LFC from the supply system to the supply nozzle in the liquid processing unit of FIG. 5. FIG. 6 illustrates a case where the processing solution is supplied through the front surface processing solution supply nozzle 45. Further, in FIG. 6, same reference numerals will be assigned to same components explained above with reference to FIGS. 4 and 5, and explanation thereof may be omitted.

As depicted in FIG. 6, the first LFC 131 of the first processing solution supply mechanism 130 may include the differential pressure flowmeter 132, the motor valve 133, and the flow rate controller 134. The differential pressure flowmeter 132 is provided on the supply path 68a and measures a flow rate of the supply path 68a as described below. The motor valve 133 is provided on the supply path 68a and controls an opening degree of a valve 160 by a motor 169 as described later.

The differential pressure flowmeter 132 may include a throttling unit 132a, a pressure measurement unit 132b, and an operation unit 132c. The throttling unit 132a is provided on the way of the supply path 68a to make the supply path 68a narrow. The pressure measurement unit 132b may include a first pressure gauge 132d and a second pressure gauge 132e. The first pressure gauge 132d is provided on a supply path 68f on an upstream side of the throttling unit 132a and measures a pressure of a fluid flowing through the supply path 68f on the upstream side of the throttling unit 132a. The second pressure gauge 132e is provided on a supply path 68g on a downstream side of the throttling unit 132a and measures a pressure of a fluid flowing through the supply path 68g on the downstream side of the throttling unit 132a.

When the processing solution is supplied through the front surface processing solution supply nozzle 45, the opening/closing valve 135 and the supply system switching valve 80d are switched so as to connect the processing solution pipe set 70 with the front surface processing solution supply nozzle 45. That is, the opening/closing valve 135 is opened and a switch to the SC1 pipe 70a for supplying the ammonia hydrogen peroxide mixture SC1 is carried out by the supply system switching valve 80d.

The operation unit 132c calculates a flow rate operation value FM of the supply path 68a (68f and 68g) based on a pressure difference P1−P2 between a first pressure measurement value P1 measured by the first pressure gauge 132d of the pressure measurement unit 132b and a second pressure measurement value P2 measured by the second pressure gauge 132e of the pressure measurement unit 132b. The operation unit 132c calculates the flow rate operation value FM, and, thus, the differential pressure flowmeter 132 can measure a flow rate. The operation unit 132c outputs a measurement signal SM including the flow rate operation value FM to the flow rate controller 134.

The flow rate controller 134 controls an opening degree of the motor valve 133 based on a preset flow rate set value FS and the flow rate operation value FM measured by the differential pressure flowmeter 132. The flow rate controller 134 receives the measurement signal SM including the flow rate operation value FM from the differential pressure flowmeter 132 and the flow rate controller 134 outputs a control signal SC for controlling the opening degree of the motor valve 133 to the motor valve 133. That is, the flow rate controller 134 outputs the control signal SC for controlling the opening degree of the motor valve 133 based on a pressure difference between the first pressure measurement value P1 and the second pressure measurement value P2 measured by the pressure measurement unit 132b.

The flow rate set value FS may be preset by the flow rate controller 134 or may be set by the process controller 201 of the controller 200 which controls the substrate processing apparatus 100. If the process controller 201 presets the flow rate set value FS, the flow rate controller 134 compares the flow rate set value FS preset by the process controller 201 with the flow rate measurement value FM and controls the opening degree of the motor valve 133 such that the flow rate measurement value FM becomes equal to the flow rate set value FS.

Further, the measurement signal SM including the flow rate operation value FM may be transmitted from the flow rate controller 134 to the process controller 201 so as to display the flow rate operation value FM on the user interface 202 explained above with reference to FIG. 4.

Furthermore, the storage 203 serving as a storage medium (recording medium) may store a control program, i.e., a recipe, for performing a substrate processing method under a control of the process controller 201 and the substrate processing method includes a measurement process, a determination process, and an alarm output process as described below with reference to FIG. 10.

Figure 7:
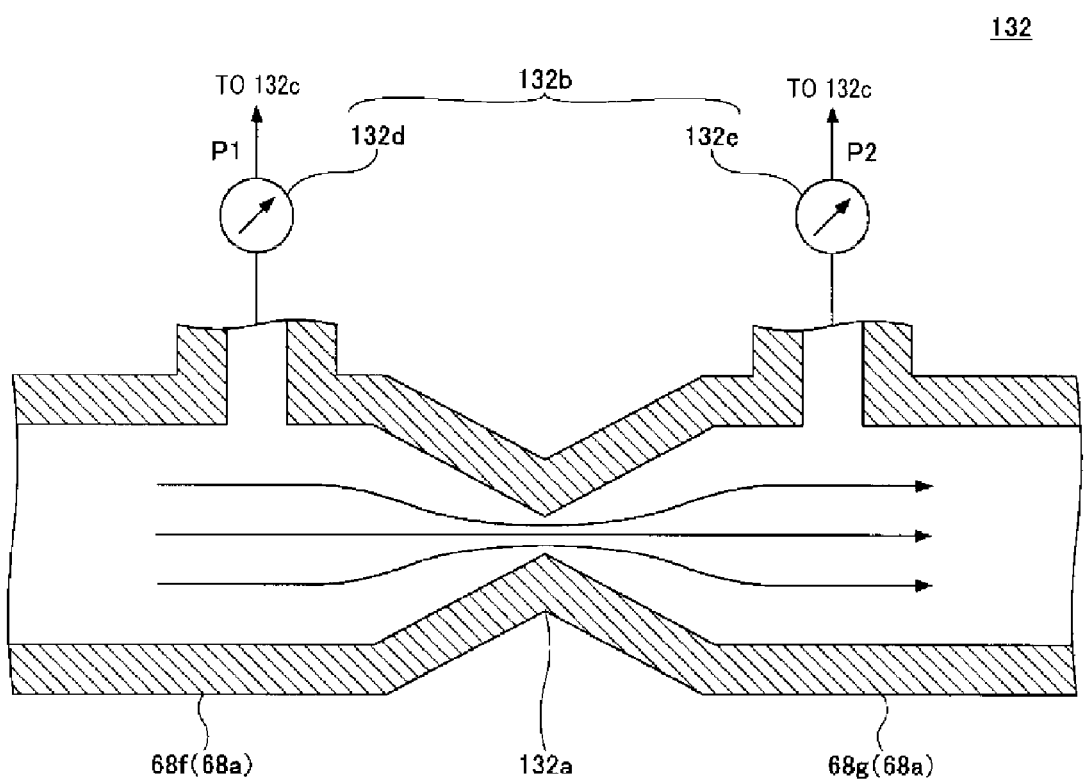
FIG. 7 is a schematic diagram showing a configuration of a throttling unit and a pressure measurement unit of a differential pressure flowmeter.

FIG. 7 is a schematic diagram showing a configuration of the throttling unit and the pressure measurement unit of the differential pressure flowmeter. The differential pressure flowmeter measures a pressure difference (differential pressure) between two different points on a flow path and calculates a flow rate of a fluid flowing through the flow path based on Beroulli's theorem. Accordingly, the differential pressure flowmeter 132 may include the throttling unit 132*a* which narrows the flow path to make a differential pressure; and the pressure measurement unit 132*b* including the pressure gauges 132*d* and 132*e* provided on both sides of the throttling unit 132*a* to measure a pressure of a fluid in the flow path. As the throttling unit 132*a* of the differential pressure flowmeter 132, an orifice, a venturi tube, a flow nozzle, or a pitot tube may be used. Further, as the pressure gauges 132*d* and 132*e* of the pressure measurement unit 132*b* of the differential pressure flowmeter 13, bourdon tube pressure gauges, diaphragm pressure gauges, bellows pressure gauges, or strain gauges may be used. In the embodiment, by way of example, an orifice is used as the throttling unit 132*a* and strain gauges are used as the pressure gauges 132*d* and 132*e*.

As depicted in FIG. 7, the first pressure gauge 132*d* is provided on the supply path 68*f* on an upstream side of the orifice (throttling unit) 132*a* and the second pressure gauge 132*e* is provided on the supply path 68*g* on a downstream side of the orifice (throttling unit) 132*a*. The pressure (first pressure measurement value) P1 of the fluid in the supply path 68*f* measured by the first pressure gauge 132*d*, the pressure (second pressure measurement value) P2 of the fluid in the supply path 68*g* measured by the second pressure gauge 132*e*, and the flow rate FM have a correlation as expressed in the following equation (1).

$$FM = CA_0 \{2(P1-P2)/\rho_x\}^{1/2} \quad (1)$$

Herein, $A_0$ is a cross sectional area of the throttling unit 132*a*, $\rho_x$ is a specific gravity of the fluid (here, X represents a kind of a fluid), and C is a discharge coefficient. In the embodiment, the pressures P1 and P2 are inputted to the operation unit 132*c* and the operation unit 132*c* calculates the flow rate operation value FM based on the equation (1).

Figure 8:
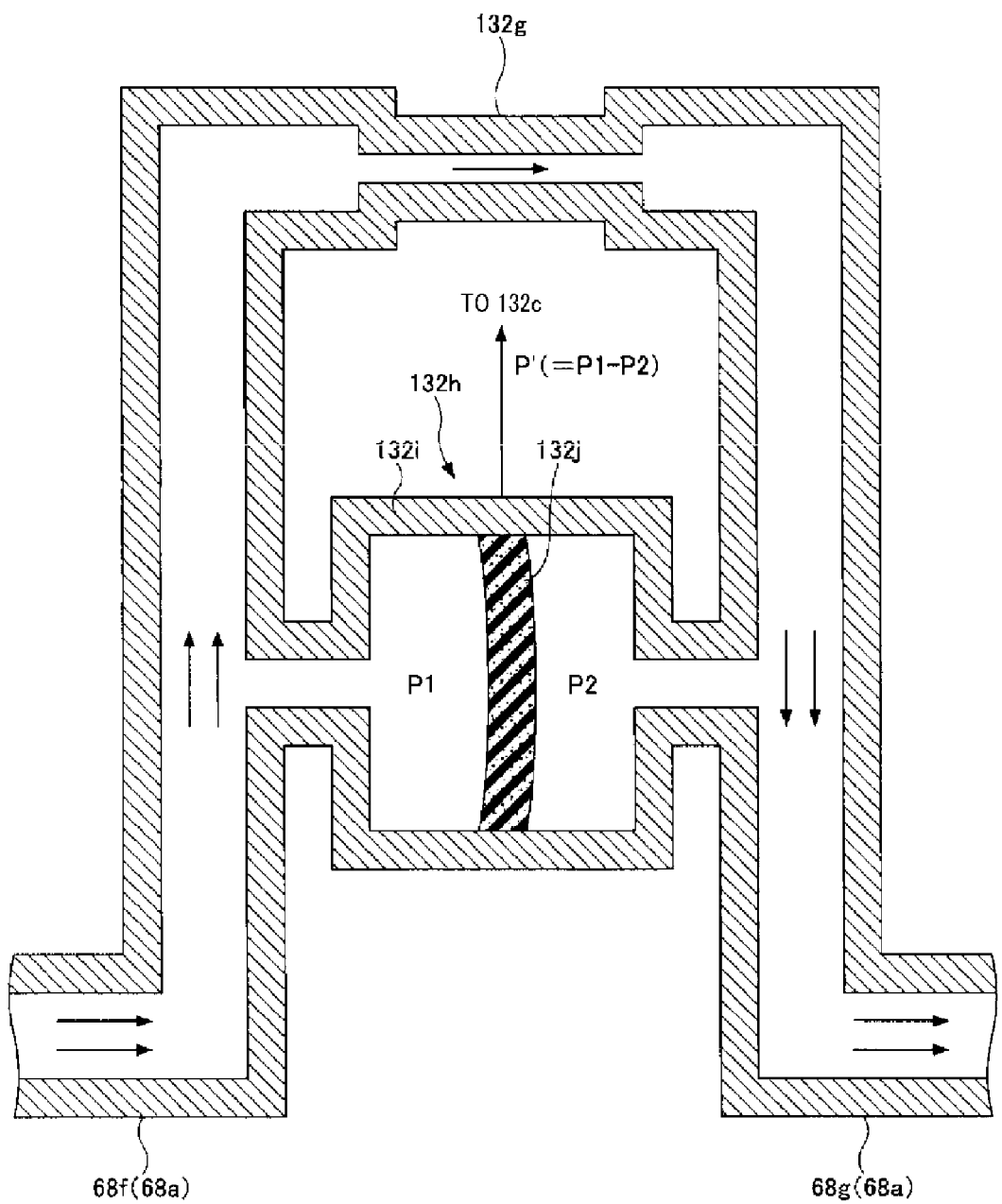
FIG. 8 is a schematic diagram showing a configuration of a differential pressure flowmeter including a differential pressure sensor.

Meanwhile, in the differential pressure flowmeter, it is possible for the pressure measurement unit 132*b* not to have the first pressure gauge 132*d* and the second pressure gauge 132*e* to obtain a pressure difference between the first pressure measurement value P1 and the second pressure measurement value P2 as explained above with reference to FIGS. 6 and 7. It is sufficient, if the differential pressure flowmeter measures a pressure difference between two different points on the supply path 68*a*, the pressure measurement unit 132*b* may not include the first pressure gauge 132*d* and the second pressure gauge 132*e* separately. Hereinafter, there will be explained a case where a pressure measurement unit includes a differential pressure sensor instead of the first and second pressure gauges with reference to FIG. 8. FIG. 8 is a schematic diagram showing a configuration of a differential pressure flowmeter including a differential pressure sensor.

As depicted in FIG. 8, a differential pressure flowmeter 132*f* may include a capillary 132*g* and a differential pressure sensor 132*h*. The differential pressure sensor 132*h* may include a communication unit 132*i* and a diaphragm 132*j* and correspond to the pressure measurement unit. The capillary 132*g* is provided on the way of the supply path 68*a* to make the supply path 68*a* narrow. The supply path 68*f* on the upstream side and the supply path 68*g* on the downstream side are formed into a U-shape with the capillary 132*g* interposed therebetween. The communication unit 132*i* is provided such that the supply path 68*f* on the upstream side communicates with the supply path 68*g* on the downstream side. The diaphragm 132*j* is provided such that the communication unit 132*i* shuts the communication between the supply path 68*f* on the upstream side and the supply path 68*g* on the downstream side. Since the pressure P1 is applied to the diaphragm 132*j* on the side of the supply path 68*f* and the pressure P2 is applied to the diaphragm 132*j* on the side of the supply path 68*g*, warpage is generated depending on a pressure difference P'=P1−P2. The differential pressure sensor 132*h* detects the amount of the generated warpage and calculates a pressure difference P'=P1−P2 based on the detected warpage amount. The pressure difference P' calculated by the differential pressure sensor 132*h* is transmitted as a signal to, for example, the operation unit 132*c* as depicted in FIG. 6 and the operation unit 132*c* calculates a flow rate measurement value FM based on the pressure difference P'.

Figure 9:
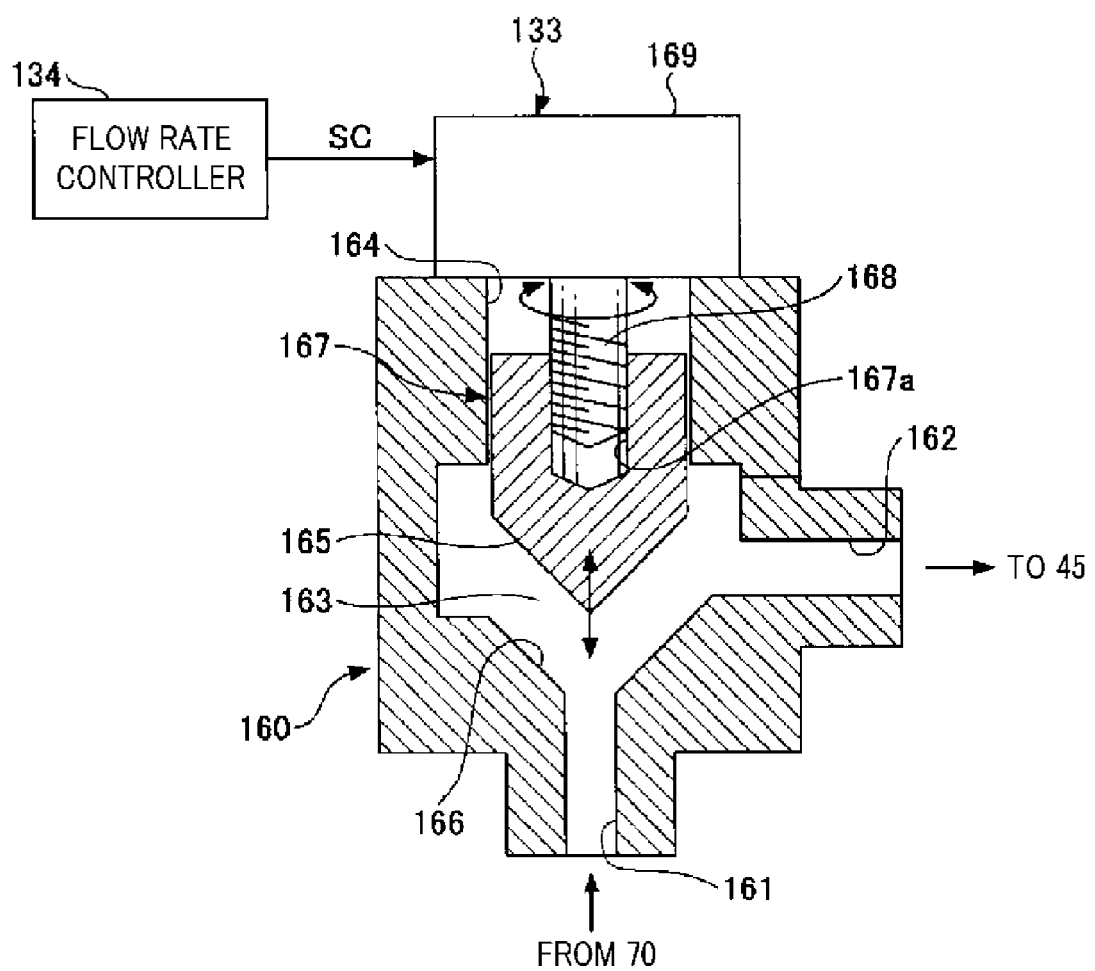
FIG. 9 is a cross-sectional view schematically showing a configuration of a motor valve.

FIG. 9 is a cross-sectional view schematically showing a configuration of the motor valve. As depicted in FIG. 9, the motor valve 133 may include the valve 160 and the motor 169 provided on the valve 160.

The valve 160 may include a supply port 161 provided so as to extend downwardly and connected to the processing solution pipe set 70 as a multiple number of supply systems via the supply system switching valve 80*d*; and a discharge port 162 provided so as to extend toward the side of the valve 160 and connected to the supply nozzle 45. Further, the valve 160 may further include a communication path 163 which allows the supply port 161 to communicate with the discharge port 162; and an opening 164 opened to an upper region of the communication path 163. Furthermore, the valve 160 may further include a valve body 167 which is slidably inserted into the opening 164 and of which a valve part 165 on a bottom surface can be placed on a valve seat 166 formed on the communication path 163. Moreover, the valve 160 may further include a male screw 168 to be screw-coupled into a female screw hole 167*a* formed in the valve body 167.

A rotation shaft of the motor 169 is connected with the male screw 168. Therefore, the male screw 168 is provided so as to be rotated forwardly or backwardly.

In the motor valve 133 configured as described above, the motor 169 is rotated forwardly or backwardly in response to a control signal SC from the flow rate controller 134, so that an opening degree of the communication path 163 is adjusted and a flow rate of a processing solution supplied to the supply nozzle 45 can be controlled.

In the embodiment, the flow rate controller 134 may control the opening degree of the motor valve 133 based on the preset flow rate set value FS and the flow rate measurement value FM measured by the differential pressure flowmeter 132. Otherwise, the flow rate controller 134 may compare the flow rate set value FS preset by the controller 200 with the flow rate measurement value FM and control the opening degree of the motor valve 133 such that the flow rate measurement value FM becomes equal to the flow rate set value FS.

Hereinafter, it will be explained a method of detecting deviation of a flow rate measurement value from a true value by the substrate processing apparatus in accordance with the embodiment of the present disclosure with reference to FIGS. 10 to 12.

Figure 10:
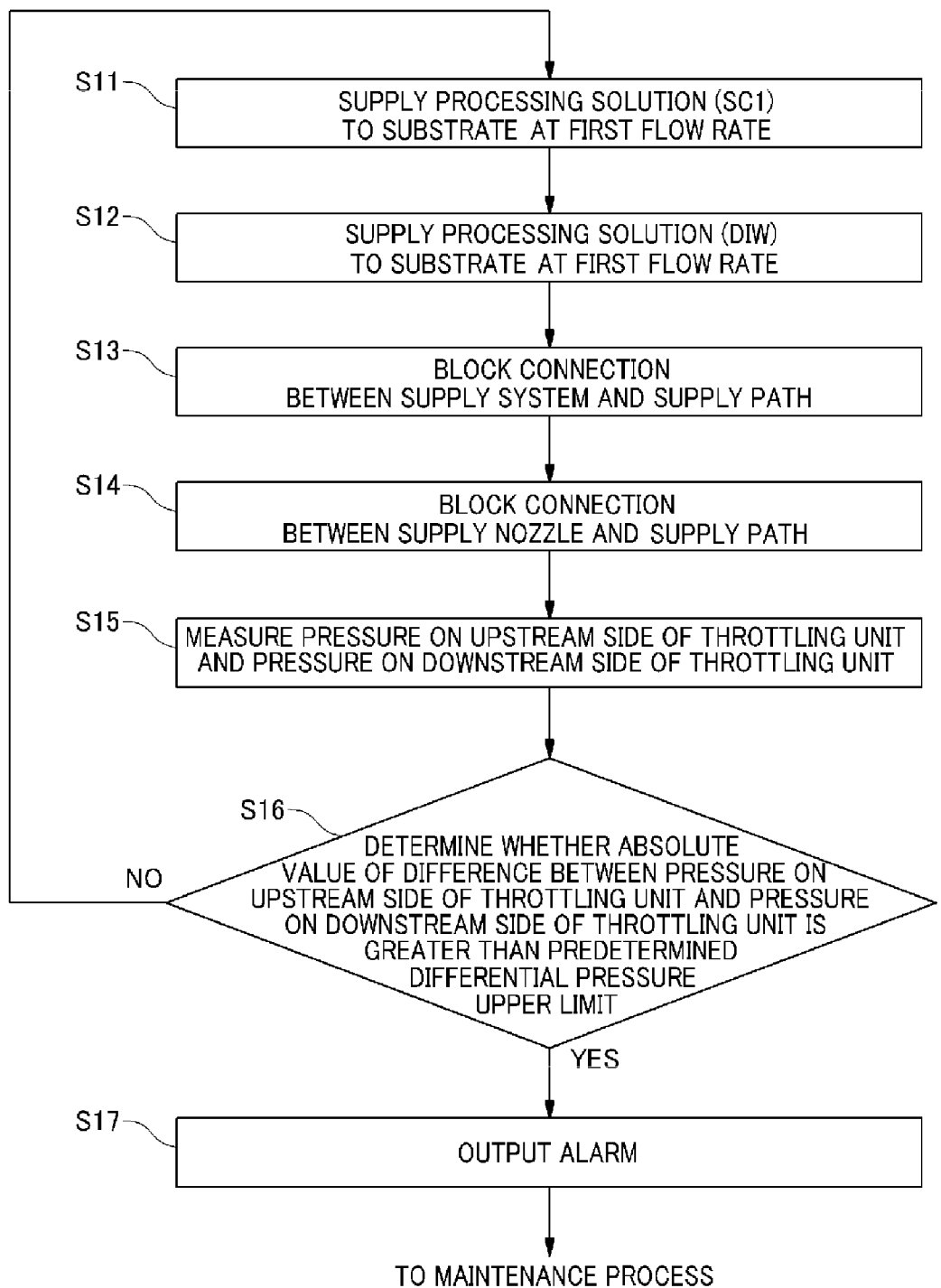
FIG. 10 is a flowchart for explaining a sequence of processes of a substrate processing method in accordance with the embodiment of the present disclosure and the substrate processing method includes a detection process which detects deviation of a measurement value of a flow rate from a true value by the substrate processing apparatus.

FIG. 10 is a flowchart for explaining a sequence of processes of a substrate processing method in accordance with the embodiment of the present disclosure and the substrate processing method includes a process of detecting deviation of a flow rate measurement value from a true value by the substrate processing apparatus. FIG. 11 is a timing chart when a substrate processing method including a process of detecting deviation of a flow rate measurement value from a true value is performed. FIG. 11 shows a preset flow rate of a first LFC, a flow rate control state of the first LFC, an opening/closing state of an upstream valve (supply system switching valve 80d) of a throttling unit, and an opening/closing state of a downstream valve (opening/closing valve 135) of the throttling unit in sequence from the top to the bottom. FIG. 12 is a graph schematically showing variation in a flow rate and a pressure difference over time when a substrate processing method including a process of detecting deviation of a flow rate measurement value from a true value is performed. In FIG. 12, a thin solid line represents a flow rate over time on a left vertical axis and a thick solid line represents a pressure difference over time on a right vertical axis.

As depicted in FIG. 10, a substrate processing method in accordance with the embodiment of the present disclosure may include a first supply process (step S11), a second supply process (step S12), and a flow rate deviation detection process (step S13 to step S17). The flow rate deviation detection process may include a supply system closing process (step S13), a nozzle closing process (step S14), a measurement process (step S15), a determination process (step S16), and an alarm output process (step S17).

First of all, the first supply process (step S11) is performed. In the first supply process (step S11), as described above, the supply system switching valve 80d and the opening/closing valve 135 are switched such that the processing solution pipe set 70 is connected to the front surface processing solution supply nozzle 45 and a processing solution including, for example, an ammonia hydrogen peroxide mixture SC1 is supplied through the front surface processing solution supply nozzle 45 to the wafer W at the first flow rate F1.

Figure 11:
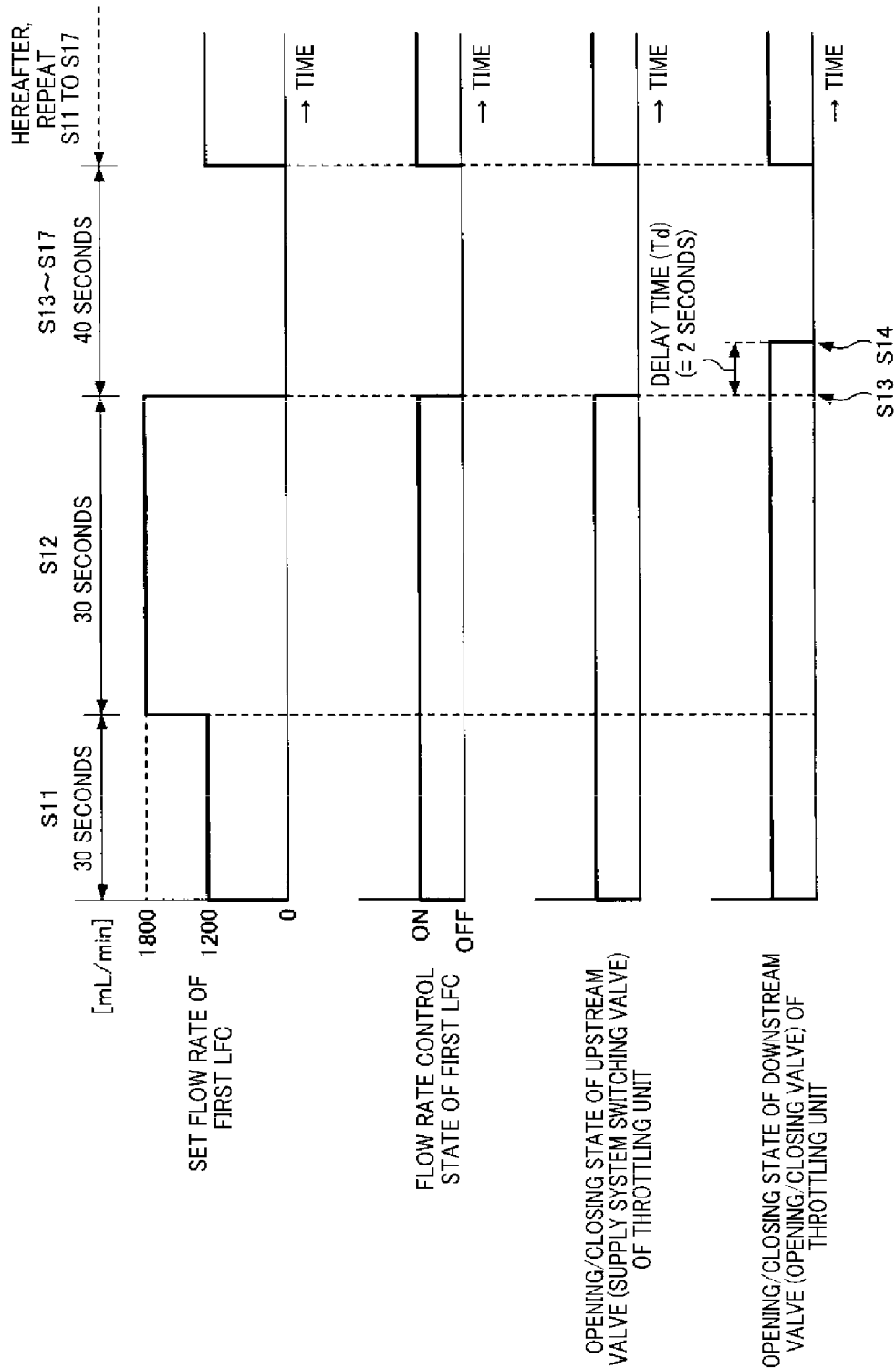
FIG. 11 is a timing chart when a substrate processing method including a process of detecting deviation of a measurement value of a flow rate from a true value is performed.

As depicted in FIG. 11, in step S11, the first LFC 131 is an ON state, the valve 80a of the supply system switching valve 80d is opened, and the opening/closing valve 135 is opened. Further, a time for performing step S11 may be set to be, for example, about 30 seconds and a preset flow rate FS may be set to be, for example, about 1200 mL/min. Furthermore, a temperature of the ammonia hydrogen peroxide mixture SC1 supplied through the front surface processing solution supply nozzle 45 may be set to be, for example, about 80° C. Moreover, as shown in FIG. 12, a pressure difference P1−P2 may be set to be, for example, about 30 kPa.

Thereafter, the second supply process (step S12) is performed. In the second supply process (step S12), the opening/closing valve 135 is still opened such that the processing solution pipe set 70 is connected to the front surface processing solution supply nozzle 45, a processing solution including, for example, deionized water DIW is supplied through the front surface processing solution supply nozzle 45 to the wafer W at the first flow rate F1.

As depicted in FIG. 11, in this step, the first LFC 131 is an ON state, the valve 80b of the supply system switching valve 80d is opened, and the opening/closing valve 135 is opened. Further, a time for performing step S12 may be set to be, for example, about 30 seconds and a preset flow rate FS may be set to be, for example, about 1800 mL/min. Furthermore, a temperature of the deionized water DIW supplied through the front surface processing solution supply nozzle 45 may be set to be, for example, about 25° C. Moreover, as shown in FIG. 12, a pressure difference P1−P2 may be set to be, for example, about 60 kPa.

Then, the flow rate deviation detection process including the supply system closing process (step 13) to the alarm output process (step S17) is performed. As depicted in FIG. 11, a time for performing the flow rate deviation detection process may be set to be, for example, about 40 seconds. Further, as shown in FIG. 11, the first LFC 131 is an OFF state during the flow rate deviation detection process.

Further, during the supply system closing process (step 13) to the alarm output process (step S17), a processing solution on the substrate is dried to be removed therefrom (a drying process).

Above all, the supply system closing process (step S13) is performed. In the supply system closing process (step S13), connection between the processing solution pipe set 70 corresponding to a supply system in Claims and the supply path 68a is blocked. To be specific, the valves 80a and 80b of the supply system switching valve 80d are closed, and the connection between the supply path 68a and all pipes 70 including the SC1 pipe 70a and the deionized water pipe 70b is blocked.

As depicted in FIG. 11, in step S13, all valves of the supply system switching valve 80d is closed but the opening/closing valve 135 is opened.

Figure 12:
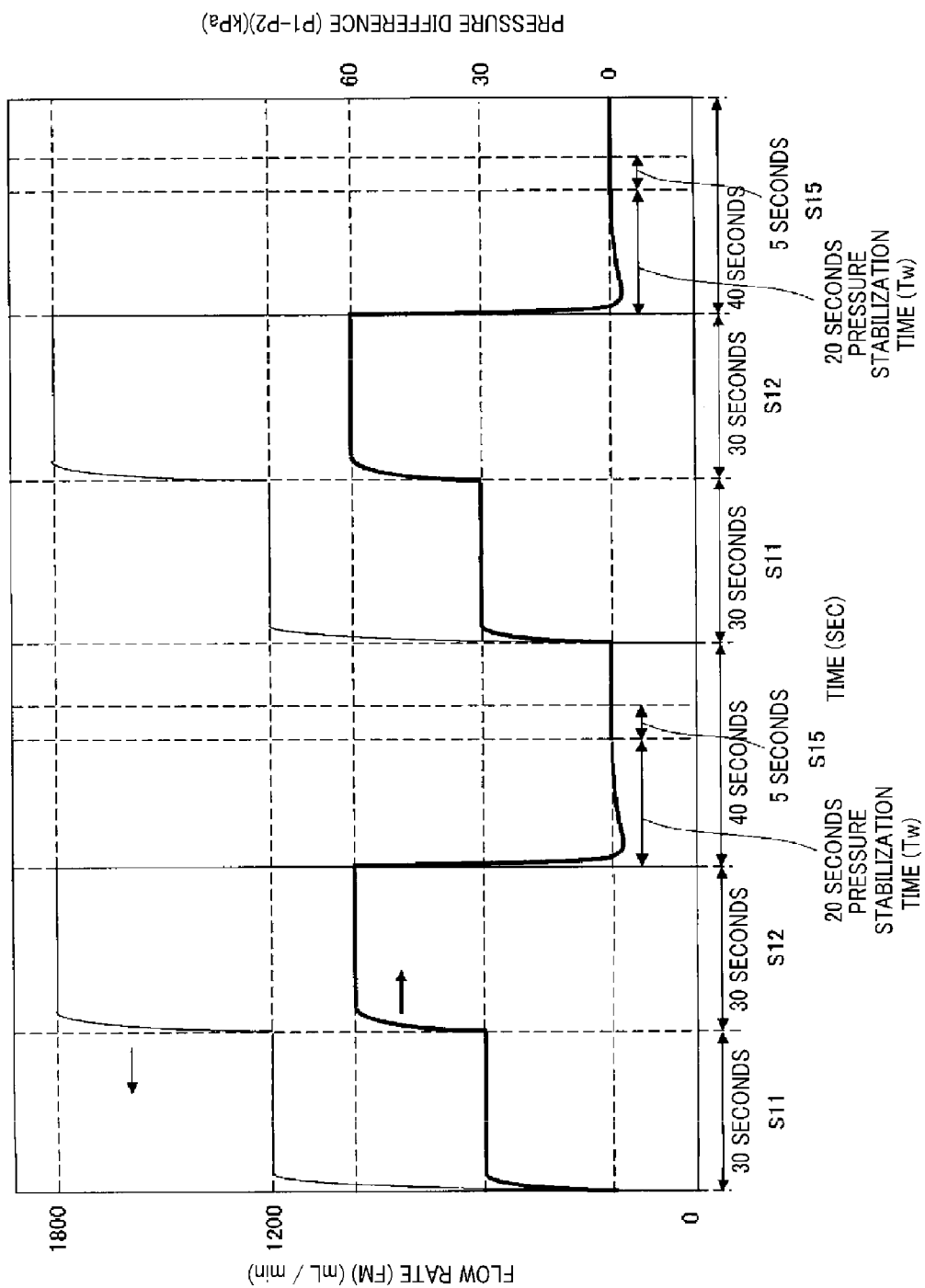
FIG. 12 is a graph schematically showing variation in a flow rate and a pressure difference over time when substrate processing method including a process of detecting deviation of a measurement value of a flow rate from a true value is performed.

As depicted in FIG. 12, all valves of the supply system switching valve 80d are closed, and, thus, supply of the processing solution through the front surface processing solution supply nozzle 45 is stopped. Consequently, a flow rate of the supply path 68a becomes about 0 immediately and also, a pressure difference P1−P2 becomes about 0.

Subsequently, the nozzle closing process (step S14) is performed. In the nozzle closing process (step S14), connection between the supply nozzle 45 and the supply path 68a is blocked. To be specific, the opening/closing valve 135 is closed, and the connection between the front surface processing solution supply nozzle 45 and the supply path 68a is blocked.

As shown in FIG. 11, it is desirable not to perform step S14 until a delay time Td elapses after step S13. Further, in step S14, the first LFC 131 is still an OFF state, all valves of the supply system switching valve 80d are closed, and the opening/closing valve 135 is closed. Further, as depicted in FIG. 12, the flow rate of the supply path 68a is still about 0 and the pressure difference P1−P2 is still about 0.

If step S14 and step S13 are substantially performed at the same time, the opening/closing valve 135 is closed suddenly, so that the pressure sharply increases due to inertia of a fluid. Accordingly, water pressure due to a shock or vibration is generated in the supply path 68a (so-called "water hammer phenomenon"). Meanwhile, if step S14 is performed later than step S13 by the delay time Td, the water hammer phenomenon can be prevented when the supply of the processing solution is stopped. The delay time Td may be set to be, for example, about 2 seconds.

Thereafter, the measurement process (step S15) is performed. In the measurement process (step S15), after the pressures become stable, the pressures on the upstream side and the downstream side of the throttling unit 132a are measured. To be specific, the first pressure gauge 132d measures a first pressure measurement value and the second pressure gauge 132e measures a second pressure measurement value. Further, the first pressure measurement value and the second pressure measurement value will be referred to as "PC1" and "PC2", respectively, in order to distinguish them from the pressure measurement value at the time when the processing solution is supplied to the substrate.

Immediately after step S13 and step S14 are performed, the pressure difference P1–P2 may be unstable and may not reach a constant value. Therefore, as depicted in FIG. 12, step S15 is not performed until a pressure stabilization time Tw, during which the pressure difference P1–P2 reaches about 0 and becomes stable, elapses after step S13. Since the pressure stabilization time Tw is longer than the delay time Td, step S15 is performed when sufficient time elapses after step S14. As depicted in FIG. 12, the pressure stabilization time Tw may be set to be, for example, about 20 seconds.

Then, the determination process (step S16) is performed. In the determination process (step S16), an absolute value of the pressure difference measured in the measurement process (step S15) is compared with a predetermined differential pressure upper limit, so that it is determined whether or not the pressure measurement unit 132b is operated normally.

To be specific, the operation unit 132c calculates an absolute value $\Delta PCM$ of the pressure difference P1–P2 between the first pressure measurement value PC1 and the second pressure measurement value PC2. Then, it is determined whether or not the absolute value $\Delta PCM$ of the pressure difference is greater than a predetermined differential pressure upper limit $\Delta PCS$. That is, the absolute value $\Delta PCM$ of the pressure difference is compared with the predetermined differential pressure upper limit $\Delta PCS$.

Herein, the predetermined differential pressure upper limit $\Delta PCS$ is set within the range in which the substrate is deemed to be processed normally by the processing solution. By way of example, if the range in which the process is deemed to be performed normally is within ±10%, the predetermined differential pressure upper limit $\Delta PCS$ is set to be about ±5% which is within the range of ±10%.

As explained by using Equation (1), the flow rate is proportional to, for example, the root of the pressure difference P1–P2. In the measurement process (step S15), since a flow rate of a fluid in the supply path 68a is about 0, the pressure difference P1–P2 becomes equal to about 0, and, thus, the absolute value $\Delta PCM$ becomes about 0 in theory. Here, if the first pressure gauge 132d and the second pressure gauge 132e are operated normally, the absolute value $\Delta PCM$ is smaller than the predetermined differential pressure upper limit $\Delta PCS$ and in the differential pressure flowmeter 132, deviation of a measurement value of the flow rate from a true value is not detected. In other words, when the absolute value $\Delta PCM$ is smaller than the predetermined differential pressure upper limit $\Delta PCS$, the pressure measurement unit 132b is supposed to be operated normally. Therefore, by comparing the absolute value $\Delta PCM$ of the pressure difference with the predetermined differential pressure upper limit $\Delta PCS$, it is possible to determine whether or not the pressure measurement unit 132b is operated normally.

When the deviation of the measurement value of the flow rate from the true value is not detected, the process returns to step S11 and each process after step S11 is performed to the next substrate. That is, in the determination process (step S16), if it is determined that the pressure measurement unit 132b is operated normally, each process after the first supply process (step S11) of supplying the processing solution to the wafer is performed.

Meanwhile, if the absolute value $\Delta PCM$ is greater than the predetermined differential pressure upper limit $\Delta PCS$, the alarm output process (step S17) is performed. In the alarm output process (step S17), an alarm is outputted by a non-illustrated alarm output unit provided inside or outside the flow rate control mechanism. That is, in the embodiment, when the absolute value of the pressure difference is greater than the differential pressure upper limit, an alarm is outputted.

When the alarm output process (step S17) has been performed, a substrate processing method is stopped and a maintenance process is started. In the maintenance process, by way of example, the first pressure gauge 132d and the second pressure gauge 132e may be replaced or the entire differential pressure flowmeter 132 including the first pressure gauge 132d and the second pressure gauge 132e may be replaced. Otherwise, a flow rate through the supply nozzle 45 is measured by a measuring cup and if the measurement value is in a predetermined range, an offset value or a gain value of the first pressure gauge 132d or the second pressure gauge 132e may be adjusted and corrected. If the actual measurement value of the flow rate through the supply nozzle 45 is out of the predetermined range, the first pressure gauge 132d and the second pressure gauge 132e may be replaced together or the entire differential pressure flowmeter 132 including the first pressure gauge 132d and the second pressure gauge 132e may be replaced.

Further, as depicted in FIG. 12, when the first flow rate F1 is, for example, about 1800 mL/min, a pressure difference P1–P2 can be, for example, about 60 kPa. In this case, a differential pressure upper limit $\Delta PCS$ may be set to be, for example, 3 kPa (±5%), so that it is possible to monitor whether deviation of a flow rate measurement value from a true value is in the range of about 5% when the first flow rate F1 is about 1800 mL/min.

In accordance with the embodiment, a pressure difference becomes about 0 when the processing solution does not flow through the supply path. By considering this fact, when the substrate processing apparatus does not supply the processing solution to the substrate and also, the connection between the supply system and the supply path is blocked, deviation of the flow rate is detected. Accordingly, it is possible to easily detect that a measurement value of the flow rate measured by the differential pressure flowmeter is deviated from a true value. That is, it is possible to detect fault in the differential pressure flowmeter.

Further, in accordance with the embodiment, it is sufficient to install the operation unit of the flow rate control mechanism of the substrate processing apparatus or software of the flow rate controller, and hardware need not be added to the substrate processing apparatus. Therefore, a cost for the substrate processing apparatus may be not increased.

Furthermore, in case of using the differential pressure flowmeter including the differential pressure sensor measuring pressure differences on the upstream side and the downstream side by using a diaphragm, it is possible to easily detect deviation of a measurement value of the flow rate from a true value.

In the embodiment, there has been explained a case where when the short delay time Td of, for example, about 2 seconds elapses after the supply system closing process (step S13), the nozzle closing process (step S14) is performed. However, by increasing the delay time Td, a pressure of a fluid in the supply path 68a is set to be substantially equal to the atmospheric pressure (i.e., the first pressure measurement value PC1 and the second pressure measurement value PC2 are set to be substantially equal to about 0), and then, the nozzle closing process (step S14) may be performed. In this case, it is possible to detect deviation of the flow rate when both the first pressure measurement value PC1 and the second pressure measurement value PC2 are substantially equal to about 0.

Further, in the embodiment, there has been explained a case where the throttling unit is provided between the supply path on the upstream side and the supply path on the downstream side in order to narrow the supply path. However, it is sufficient if a pressure difference between the supply path on the upstream side and the supply path on the downstream side is generated. Instead of narrowing the supply path, there may be provided a connection unit which extends a length of a path where the supply path on the upstream side is connected with the supply path on the downstream side.

Furthermore, in accordance with the embodiment, in the determination process, it is determined whether the pressure measurement unit is operated normally by comparing the absolute value of the difference between the pressure on the upstream side and the pressure on the downstream side with the predetermined differential pressure upper limit. However, if it is known that one of the pressures on the upstream side and downstream side is normal, the other pressure is measured, and by comparing the measured pressure value with a predetermined pressure value, it may be determined whether the pressure measurement unit is operated normally.

In the substrate processing apparatus of the embodiment, unprocessed substrates are loaded in sequence into each liquid processing unit and processed substrates are unloaded therefrom by the transfer mechanism 24. In the embodiment, the flow rate deviation detection process for the differential pressure flowmeter may be performed regularly depending on the number of processes and processing time, but it is desirable to perform the process for each time a substrate is processed. With respect to substrates continuously loaded into the liquid processing unit, if the flow rate deviation detection process is performed for each time the substrate is processed, when it is determined that the pressure measurement unit is operated normally in the determination process, the process controller 201 controls the process such that the next substrate is loaded into this liquid processing unit by the transfer mechanism 24 and the processing solution is supplied to the loaded substrate. Meanwhile, when it is determined that the pressure measurement unit is not operated normally in the determination process, the process controller 201 controls the process such that the next substrate is not loaded into this liquid processing unit by the transfer mechanism 24. Desirably, the process controller 201 may control the process such that the non-loaded substrate is transferred to another liquid processing unit in a normal state. Further, when it is determined that the pressure measurement unit is not operated normally in the determination process, the processed substrate may be recorded as a substrate processed when the pressure measurement unit is not operated normally.

Modification Example of the Embodiment

Figure 13:
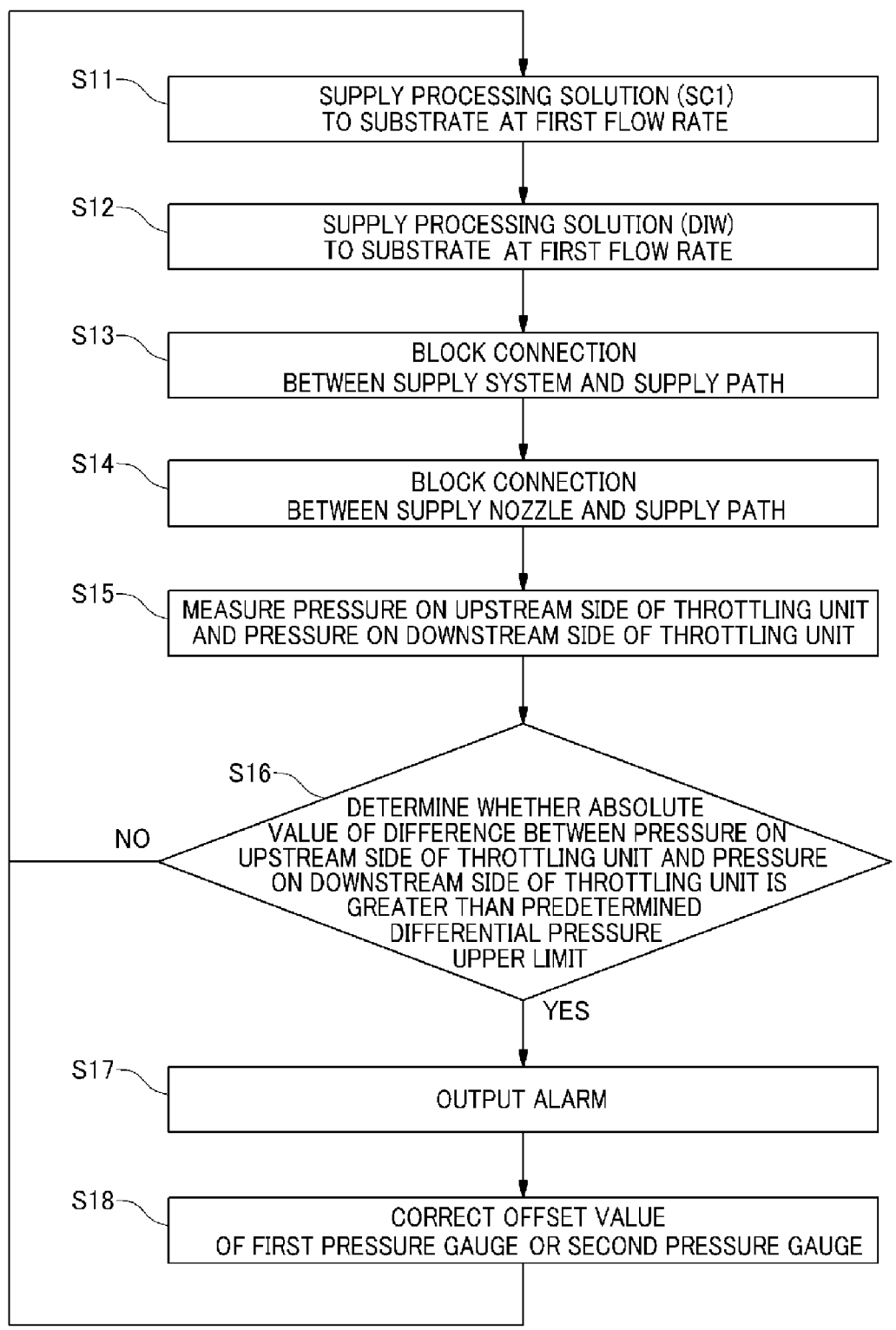
FIG. 13 is a flowchart for showing a sequence of processes of a substrate processing method in accordance with a modification example of the embodiment of the present disclosure and the substrate processing method includes a detection process which detects deviation of a measurement value of a flow rate from a true value by a substrate processing apparatus.

Hereinafter, there will be explained a substrate processing method in accordance with a modification example of the embodiment of the present disclosure with reference to FIG. 13. FIG. 13 is a flowchart for showing a sequence of processes of a substrate processing method in accordance with a modification example of the embodiment of the present disclosure and the substrate processing method includes a process of detecting deviation of a measurement value of a flow rate from a true value by a substrate processing apparatus.

The substrate processing method in accordance with the modification example is different from the substrate processing method in accordance with the embodiment in that the substrate processing method includes a process of correcting deviation of measurement values by a first pressure gauge and a second pressure gauge.

In the modification example, the substrate processing apparatus of the embodiment as explained with reference to FIGS. 1 to 3 can be used. Each unit of a substrate processing apparatus, each component of liquid processing units, and the flow rate control mechanism are the same as explained in the embodiment.

A flow rate deviation detection process in the substrate processing method in accordance with the modification example may include an offset value correction process in addition to each process explained in the embodiment. As depicted in FIG. 13, the substrate processing method in accordance with the modification example may include a fist supply process (step S11), a second supply process (step S12), and a flow rate deviation detection process (step S13 to step S18). The flow rate deviation detection process may include the offset value correction process (step S18) in addition to a supply system closing process (step S13), a nozzle closing process (step S14), a measurement process (step S15), a determination process (step S16), and an alarm output process (step S17). The first supply process (step S11) to the alarm output process (step S17) are the same as explained in the embodiment.

In the modification example, after the alarm output process (step S17), the offset value correction process (step S18) is performed. In the offset value correction process (step S18), an offset value of the first pressure gauge 132d or an offset value of the second pressure gauge 132e is corrected such that the first pressure measurement value PC1 or the second pressure measurement value PC2 becomes equal to a predetermined pressure reference value. The first pressure measurement value PC1 or the second pressure measurement value PC2 obtained in the measurement process (step S15) is substantially equal to the first pressure measurement value P1 or the second pressure measurement value P2 obtained when the processing solution is supplied to the substrate, and desirably, the measurement values P1 and P2 are substantially equal to the first pressure measurement value P1 without pressure loss. By way of example, the flow rate controller 134 may preset a pressure reference value PSt which is substantially equal to, for example, the first pressure measurement value P1 at the time when the processing solution is supplied to the substrate. Consequently, it is possible to correct the offset value of the first pressure gauge 132d or the second pressure gauge 132e such that the first pressure measurement value PC1 or the second pressure measurement value PC2 becomes equal to the pressure reference value PSt.

If the offset value correction process (step S18) is performed, deviation of the measurement value of the flow rate measured by the differential pressure flowmeter 132 from the true value may not be detected. Thus, the process returns to step S11 and each process after step S11 is performed to the next substrate. If the offset value of the first pressure gauge 132d or the offset value of the second pressure gauge 132e is out of the range and cannot be corrected, a substrate processing method is stopped and a maintenance process is started.

In the modification example, in the same manner as explained in the embodiment, a pressure difference becomes about 0 when the processing solution does not flow through the supply path. By considering this fact, when the substrate processing apparatus does not supply the processing solution to the substrate and also, the connection between the supply system and the supply path is blocked, deviation of the flow rate is detected. Accordingly, it is possible to easily detect that a measurement value of the flow rate measured by the differential pressure flowmeter is deviated from a true value.

In accordance with the modification example, when it is detected that the measurement value of the flow rate measured by the differential pressure flowmeter is deviated from the true value, the offset value of the first pressure gauge or the second pressure gauge is corrected, and, thus, the deviation of the measurement value of the flow rate measured by the differential pressure flowmeter from the true value can be easily corrected.

In the modification example, it is sufficient to install the operation unit of the flow rate control mechanism of the substrate processing apparatus or software of the flow rate controller, and hardware need not be added to the substrate processing apparatus. Therefore, a cost for the substrate processing apparatus may not be increased.

In the modification example, there has been explained a case where the offset value correction process (step S18) is performed after the alarm output process (step S17). However, the offset value correction process (step S18) may be performed before the alarm output process (step S17). By way of example, the offset value correction process (step S18) is performed at the same time as or after the measurement process (step S15). Alternatively, the offset value correction process (step S18) may be performed independently of the flow rate deviation detection process.

There has been explained the embodiment of the present disclosure, but the present disclosure is not limited to the above-described embodiment and can be modified and changed in various ways in the scope of the following claims.

What is claimed is:

1. A substrate processing method of supplying a processing solution to a substrate through a supply nozzle connected with a supply path via a differential pressure flowmeter provided on the supply path for supplying the processing solution and performing a process on the substrate by the processing solution, the method comprising:
   measuring a pressure value in the supply path by a pressure measurement unit included in the differential pressure flowmeter when the processing solution is not supplied to the substrate;
   determining whether the pressure measurement unit is operated normally by comparing the pressure value measured in the measuring process with a predetermined pressure value; and
   supplying the processing solution to a substrate if it is determined that the pressure measurement unit is operated normally in the determining process.

2. The substrate processing method of claim 1,
   wherein the measuring process measures pressures in the supply path on an upstream side and on a downstream side of a throttling unit provided on the supply path to narrow the supply path by the pressure measurement unit when the processing solution is not supplied to the substrate, and
   the determining process determines whether the pressure measurement unit is operated normally by comparing an absolute value of a pressure difference between the pressures in the supply path on the upstream side and on the downstream side measured in the measuring process with a predetermined differential pressure upper limit value.

3. The substrate processing method of claim 2,
   wherein the pressure measurement unit includes:
   a first pressure gauge configured to measure the pressure in the supply path on the upstream side; and
   a second pressure gauge configured to measure the pressure in the supply path on the downstream side, and
   wherein the pressure difference is a difference between a first pressure measurement value measured by the first pressure gauge and a second pressure measurement value measured by the second pressure gauge.

4. The substrate processing method of claim 3, further comprising:
   correcting an offset value of the first pressure gauge or an offset value of the second pressure gauge so as to allow the first pressure measurement value or the second pressure measurement value to become equal to a predetermined pressure reference value when the absolute value of the pressure difference is greater than the differential pressure upper limit value.

5. The substrate processing method of claim 1,
   wherein the processing solution is supplied to the substrate after the substrate is loaded into a processing unit configured to supply the processing solution to the substrate, the measuring process is performed after the processing solution is supplied to the substrate by the processing unit, and
   the supplying process supplies the processing solution to a next substrate subsequently loaded into the processing unit when it is determined that the pressure measurement unit is operated normally in the determining process.

6. The substrate processing method of claim 1,
   wherein the processing solution is supplied to the substrate after the substrate is loaded into a processing unit configured to supply the processing solution to the substrate, the measuring process is performed after the processing solution is supplied to the substrate by the processing unit, the supplying process supplies the processing solution to a next substrate subsequently loaded into the processing unit if it is determined that the pressure measurement unit is operated normally in the determining process, and
   a next substrate is not loaded into the processing unit if it is determined that the pressure measurement unit is not operated normally in the determining process.

7. The substrate processing method of claim 1,
   wherein a drying process is performed to remove the processing solution from the substrate during the measuring process and the determining process.

8. A non-transitory computer-readable storage medium having stored thereon a computer-executable program for executing a substrate processing method as claimed in claim 1.

9. A substrate processing apparatus configured to perform a process on a substrate by a processing solution, the apparatus comprising:
   a processing unit configured to accommodate the substrate;
   a supply nozzle configured to supply the processing solution to the substrate; and
   a differential pressure flowmeter provided on the way of a supply path connecting a supply system configured to supply the processing solution to the supply nozzle with the supply nozzle, wherein it is determined whether the differential pressure flowmeter is operated normally by comparing an absolute value of a pressure difference measured by the differential pressure flowmeter with a predetermined differential pressure upper limit value when the processing solution is not supplied to the substrate, and the processing solution is supplied to a substrate if it is determined that the differential pressure flowmeter is operated normally.

10. The substrate processing apparatus of claim 9, wherein the differential pressure flowmeter includes:

a throttling unit configured to narrow the supply path;

a first pressure gauge configured to measure a pressure in the supply path on an upstream of the throttling unit;

a second pressure gauge configured to measure a pressure in the supply path on a downstream of the throttling unit;

a flow rate control valve provided on the supply path; and a flow rate controller configured to control an opening degree of the flow rate control valve based on a pressure difference between a first pressure measurement value measured by the first pressure gauge and a second pressure measurement value measured by the second pressure gauge, and it is determined whether the first pressure gauge and the second pressure gauge are operated normally by comparing the absolute value of the pressure difference with the predetermined differential pressure upper limit value when the processing solution is not supplied to the substrate, so that it is determined whether the differential pressure flowmeter is operated normally.

11. The substrate processing apparatus of claim 9, further comprising:

a transfer mechanism configured to load the substrate into the processing unit, wherein a pressure in the supply path is measured after the processing solution is supplied to the substrate in the processing unit, and a next substrate is loaded into the processing unit by the transfer mechanism and the processing solution is supplied to the loaded next substrate if it is determined that the differential pressure flowmeter is operated normally.

12. The substrate processing apparatus of claim 9, further comprising:

a transfer mechanism configured to load the substrate into the processing unit, wherein a pressure in the supply path is measured after the processing solution is supplied to the substrate in the processing unit, and a next substrate is loaded into the processing unit by the transfer mechanism and the processing solution is supplied to the loaded next substrate if it is determined that the differential pressure flowmeter is operated normally, and a next substrate is not loaded into the processing unit when it is determined that the differential pressure flowmeter is not operated normally.

13. A fault detection method for a differential pressure flowmeter provided on a supply path configured to supply a processing solution, the method comprising:

measuring a pressure in the supply path by a pressure measurement unit included in the differential pressure flowmeter when the processing solution is not supplied; and determining whether the pressure measurement unit is operated normally by comparing a pressure value measured in the measuring process with a predetermined pressure value.

* * * * *

UNITED STATES PATENT AND TRADEMARK OFFICE
CERTIFICATE OF CORRECTION

PATENT NO. : 8,393,227 B2
APPLICATION NO. : 13/035010
DATED : March 12, 2013
INVENTOR(S) : Norihiro Ito et al.

It is certified that error appears in the above-identified patent and that said Letters Patent is hereby corrected as shown below:

On the Title page, item [75], please replace "Norihiro Itoh" with -- Norihiro Ito --

In the Specification, column 7, line 36, please add -- 72 -- after "pipe"

Signed and Sealed this
Ninth Day of July, 2013

Teresa Stanek Rea
*Acting Director of the United States Patent and Trademark Office*